(12) United States Patent
Kabagambe et al.

(10) Patent No.: US 8,557,099 B2
(45) Date of Patent: Oct. 15, 2013

(54) ELECTROCURTAIN COATING PROCESS FOR COATING SOLAR MIRRORS

(75) Inventors: Benjamin Kabagambe, Allison Park, PA (US); Donald W. Boyd, Cheswick, PA (US); Michael J. Buchanan, Cranberry Township, PA (US); Patrick Kelly, Wexford, PA (US); Luke A. Kutilek, Oakmont, PA (US); James W. McCamy, Export, PA (US); Douglas A. McPheron, Seven Fields, PA (US); Gary R. Orosz, Valencia, PA (US); Raymond D. Limbacher, New Castle, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 425 days.

(21) Appl. No.: 12/911,189

(22) Filed: Oct. 25, 2010

(65) Prior Publication Data

US 2012/0097546 A1    Apr. 26, 2012

(51) Int. Cl.
*C25D 7/08* (2006.01)
*C25D 5/00* (2006.01)
*C25D 5/02* (2006.01)
*C25D 5/08* (2006.01)

(52) U.S. Cl.
USPC ........... 205/116; 205/118; 205/122; 205/133; 205/136; 205/137

(58) Field of Classification Search
USPC ......... 205/129, 130, 118, 122, 133, 136, 116, 205/143; 204/224 R
See application file for complete search history.

(56) References Cited

U.S. PATENT DOCUMENTS

| | | | |
|---|---|---|---|
| 4,793,867 A | 12/1988 | Charles et al. | |
| 5,401,305 A | 3/1995 | Russo et al. | |
| 5,588,989 A | 12/1996 | Vonk et al. | |
| 5,989,642 A | 11/1999 | Singer et al. | |
| 6,245,855 B1 | 6/2001 | Swarup et al. | |
| 6,387,519 B1 | 5/2002 | Anderson et al. | |
| 6,916,542 B2 | 7/2005 | Buhay et al. | |
| 7,005,472 B2 | 2/2006 | Anderson et al. | |
| 7,507,324 B2 * | 3/2009 | Mazzara et al. | 205/666 |
| 7,947,157 B2 * | 5/2011 | Ravkin et al. | 204/224 R |

(Continued)

FOREIGN PATENT DOCUMENTS

WO    2005092813 A2    10/2005

OTHER PUBLICATIONS

U.S. Appl. No. 12/813,537, filed Jun. 11, 2010, Orosz et al, Method for Depositing an Electrodepositable Coating Composition onto a Substrate Using a Plurality of Liquid Streams.

(Continued)

*Primary Examiner* — Nicholas A Smith
*Assistant Examiner* — Brian W Cohen
(74) *Attorney, Agent, or Firm* — Andrew C. Siminerio

(57) ABSTRACT

An electrically conductive protective coating or film is provided over the surface of a reflective coating of a solar mirror by flowing or directing a cation containing liquid and an anion containing liquid onto the conductive surface. The cation and the anion containing liquids are spaced from, and preferably out of contact with one another on the surface of the reflective coating as an electric current is moved through the anion containing liquid, the conductive surface between the liquids and the cation containing liquid to coat the conductive surface with the electrically conductive coating.

26 Claims, 9 Drawing Sheets

(56) References Cited

U.S. PATENT DOCUMENTS

| | | | |
|---|---|---|---|
| 8,277,626 B2 * | 10/2012 | Orosz et al. | 204/511 |
| 2009/0042060 A1 | 2/2009 | Zawacky et al. | |
| 2009/0233071 A1 | 9/2009 | Medwick et al. | |
| 2010/0242953 A1 | 9/2010 | Bhandari et al. | |

OTHER PUBLICATIONS

U.S. Appl. No. 12/709,091, filed Feb. 19, 2010, Thiel, Solar Reflecting Mirror and Method of Making Same.

* cited by examiner

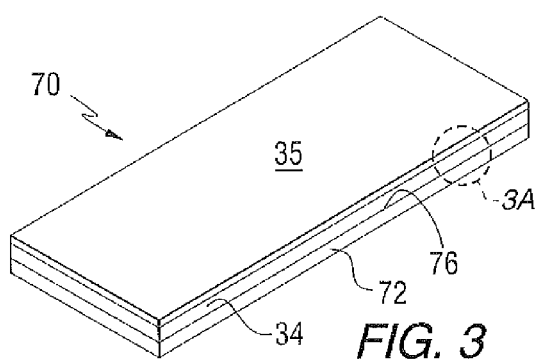
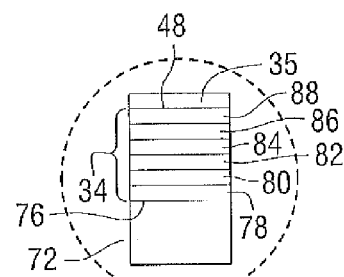
FIG. 3    FIG. 3A
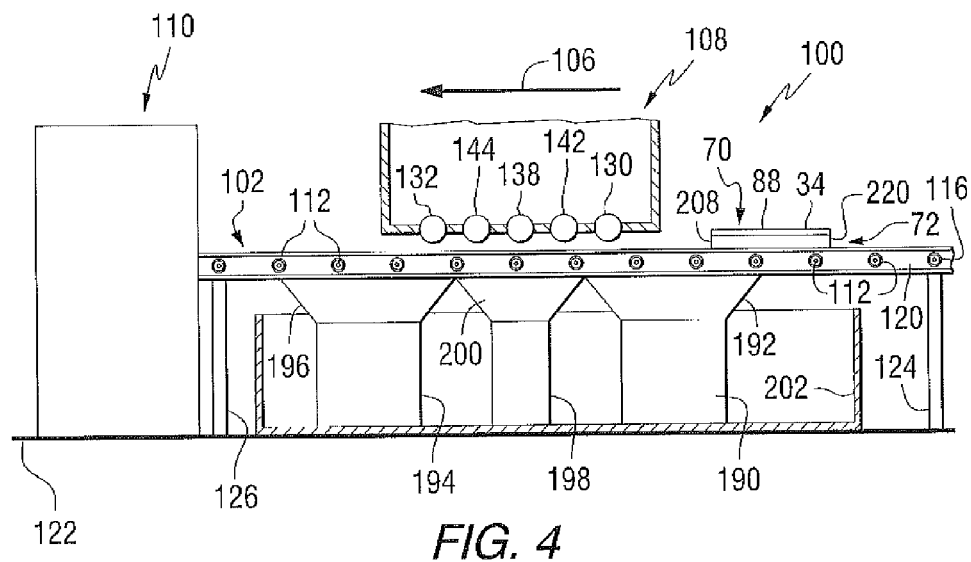
FIG. 4
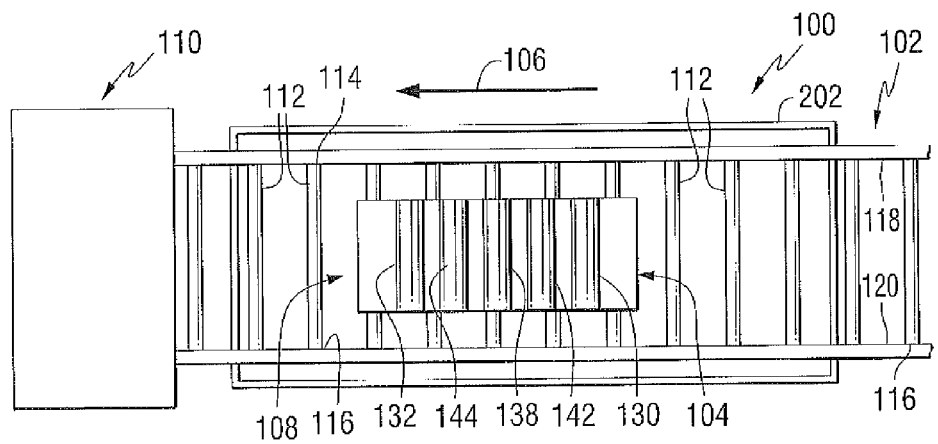
FIG. 5

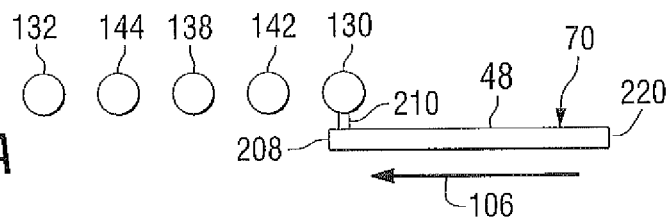
FIG. 9A
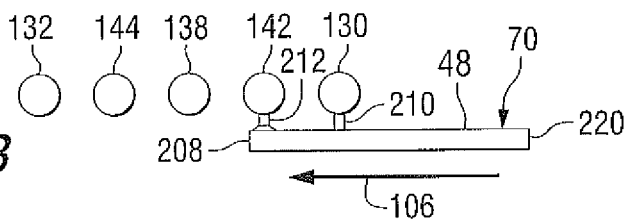
FIG. 9B
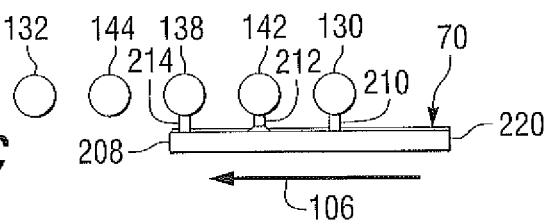
FIG. 9C
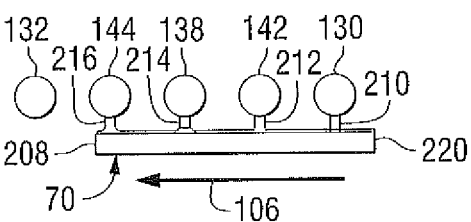
FIG. 9D
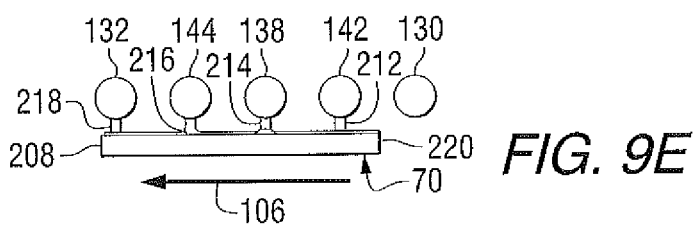
FIG. 9E
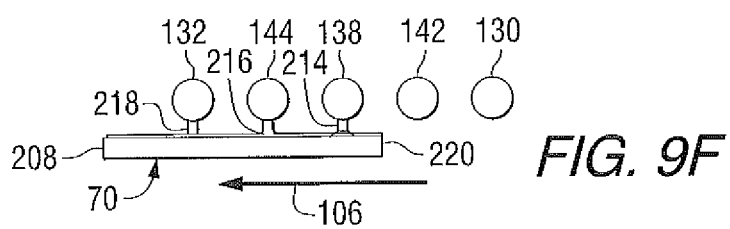
FIG. 9F
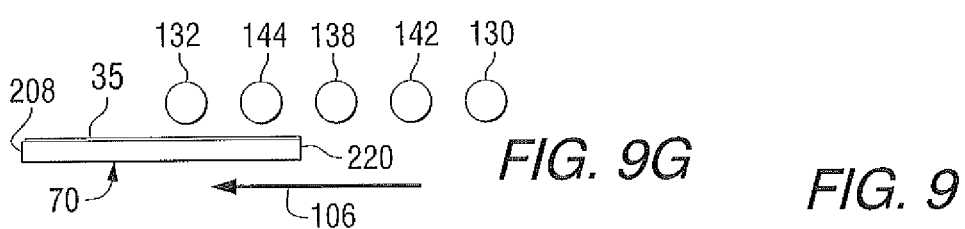
FIG. 9G
FIG. 9

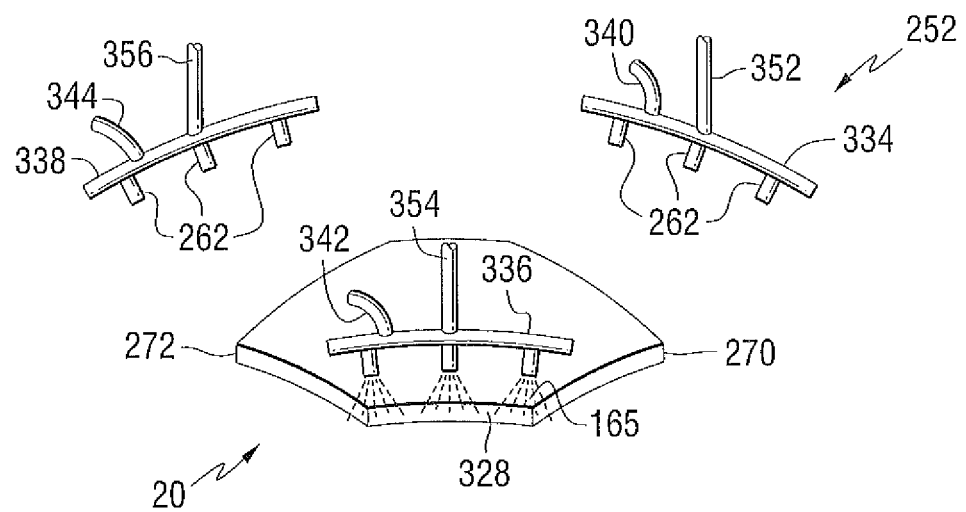
FIG. 19A
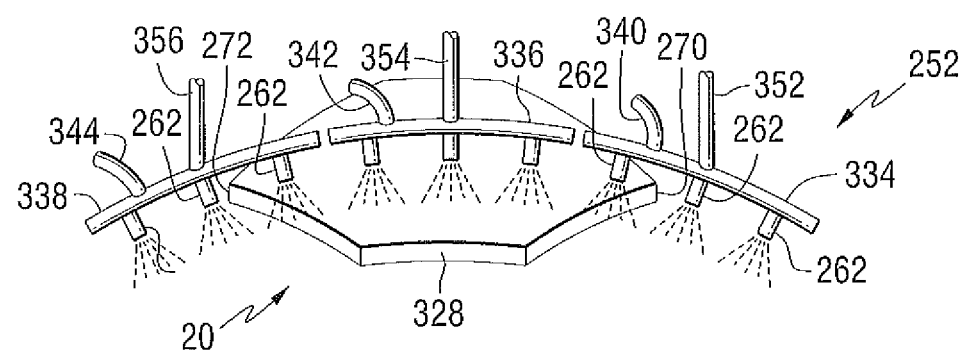
FIG. 19B
FIG. 19

ELECTROCURTAIN COATING PROCESS FOR COATING SOLAR MIRRORS

NOTICE OF GOVERNMENT SUPPORT

This invention was made with Government support under Contract No. DE FC36-08GO18033 (DOE SOLAR POWER) awarded by the Department of Energy. The United States government may have certain rights in this invention.

RELATED PATENT APPLICATION

This application is related to U.S. patent application Ser. No. 12/813,537 filed on Jun. 11, 2010 in the name of Gary R. Orosz et al and titled "METHOD FOR DEPOSITING AN ELECTRODEPOSITABLE COATING COMPOSITION ONTO A SUBSTRATE USING A PLURALITY OF LIQUID STREAMS".

BACKGROUND OF THE INVENTION

1. Field of the Invention

The present invention relates to an electrocurtain coating process for coating solar mirrors, and more particularly, to a method of depositing an electrodepositable coating composition, e.g. an electrodepositable protective coating over the reflective coating of solar mirrors through the use of a plurality of electrically conductive liquid streams.

2. Discussion of the Presently Available Technology

In general, solar mirrors include a transparent substrate, e.g. a glass substrate having a solar reflective coating on a surface of the glass substrate facing away from the sun. A coating is applied over the surface of the reflective coating exposed to the environment to protect the reflective coating against chemical attack, e.g. against oxidation and/or corrosion caused by rain and chemicals in the environment, and against mechanical damage, e.g. scratches and impact abrasion. As is known there are different techniques to apply a protective coating over a surface to protect the surface against chemical and mechanical damage. One coating technique of particular interest is the process to deposit an electrodepositable coating composition onto a surface. In this process, an electrodepositable coating, which is also referred to as an "e-coat" or electrodeposition coating composition, is deposited onto a conductive surface of a substrate using an electrical process.

In general, the e-coat coating process can be seen as an electrical circuit when an electrical current is applied to the system. In this electrical circuit, the electrodepositable coating composition has a cationic or anionic charge while the electrically conductive surface of the substrate, which is to be coated, has a charge that is opposite to that of the electrodepositable coating composition, i.e., the electrically conductive surface of the substrate can be anionic or cationic, respectively. During the coating process, a complete electrical circuit is established by a direct current rectifier thereby allowing the coating composition to deposit onto the oppositely charged conductive surface of the substrate. However, in order to complete the electrical circuit, the electrically conductive surface of the substrate is grounded or connected to the rectifier through the use of a mechanical contact, such as a clip, which contacts or is connected to the conductive surface of the substrate.

A limitation of using a mechanical contact, however, is that the point or area of contact ("contact area") will not be coated with the electrodepositable coating composition because it is covered by the contact surface of the mechanical contact and, therefore, the electrodepositable coating composition is not applied to the contact area. Since the contact area is not coated with the electrodepositable coating composition, the coating void not only detracts from the visual appearance of the solar mirror (i.e., the outer surface of the reflective coating is not uniformly coated with the electrodepositable coating composition), the coating void is also more susceptible to chemical attack when compared to an area that has been coated with the electrodepositable protective coating composition.

As can be appreciated by those skilled in the art, it would be advantageous to provide a method of depositing an electrodepositable protective coating composition on the reflective surface of a solar mirror while eliminating the mechanical contact.

SUMMARY OF THE INVENTION

The present invention is directed to a method of applying an electrically conductive coating, e.g. an electrodepositable protective coating composition over a first surface of a reflective coating of a solar mirror, wherein the solar mirror includes, among other things, a substrate having a first major surface and an opposite second major surface, the reflective coating having a second surface opposite to the first surface, wherein the second surface of the reflective coating is over a major surface of the substrate of the solar mirror. The method includes, among other things, moving a first electrically conductive liquid material over a first area of the first surface of the reflective coating; moving a second electrically conductive liquid material over a second area of the first surface of the reflective coating, wherein one of the liquid materials includes an electrodepositable coating composition; maintaining the first and the second electrically conductive liquid materials spaced from one another to provide a third area of the first surface between the first and the second areas to establish a current path through the first liquid material, the third area of the conductive surface and through the second liquid material, and moving an electric current through the current path to deposit the protective coating over the area of the first surface of the reflective coating having the electrodepositable coating composition.

This invention is also directed to a coating apparatus for applying an electrically conductive coating, e.g. an electrodepositable protective coating composition over a first surface of a solar reflective coating of a solar mirror, wherein the solar mirror includes, among other things, a substrate having a first major surface and an opposite second major surface, the reflective coating having a second surface opposite to the first surface, wherein the second surface of the reflective coating is over a major surface of the substrate, and the first surface of the reflective coating is electrically conductive. The apparatus includes, among other things, a coating arrangement having a first electrically conductive coating conduit to provide a first liquid coating curtain, a second electrically conductive coating conduit to provide a second liquid coating curtain; a third conduit to provide a first air knife, the third conduit between the first and the second conduits; a fourth electrically conductive conduit to provide a third liquid coating curtain, and a fifth conduit to provide a second air knife, the fifth conduit between the second and the fourth conduits; a motorized system to move the coating arrangement and the solar mirror relative to one another; a supply system for moving a first ion containing liquid to and through the first and the fourth conduits; a second ion containing liquid to and through the second conduit, and pressurized air through the third and the fifth conduits, wherein after the supply system is activated, a flow curtain of the first ion containing liquid is moved through the first and the fourth conduits; a flow curtain of the second ionic fluid is moved through the second conduit, and pressurized air is moved through the third and the fifth conduits, and after the motorized system is energized, portions of the first surface of the reflective coating sequentially moves through the flow curtain of the first conduit, the pressurized air of the third conduit, the flow curtain of the second conduit, the air curtain of the fifth conduit and the flow curtain of the fourth conduit, wherein the pressurized air from the third conduit maintains a first spaced distance at the first surface of the reflective coating between the flow curtains of the first and the second conduits, and the pressurized air of the fifth conduit maintains a second spaced distance at the first surface of the reflective coating between the liquid curtains from the second and the fourth conduits.

BRIEF DESCRIPTION OF THE DRAWINGS

FIG. 3 is an isometric view of a flat solar mirror having the protective film of the invention. FIG. 3A is an enlarged view of the circled portion of FIG. 3.

FIG. 4 is a side elevated view of a coating station incorporating features of the invention. Portions of the coating station are removed for purposes of clarity.

FIG. 5 is an elevated plan view of the coating station shown in FIG. 4 having the coating arrangement 108 removed for purposes of clarity.

FIG. 9 includes FIGS. 9A-9G, which are side elevated views of a sequence of events to deposit a protective coating over the reflective coating of a solar mirror in accordance to the teachings of the invention.

FIG. 19 includes FIGS. 19A and 19B to illustrate the sequence of events to move a shaped solar mirror and a flow curtain relative to one another to apply a protective film over a reflective surface of the shaped solar mirror in accordance to the teachings of the invention.

DETAILED DESCRIPTION OF THE INVENTION

Figure 1:
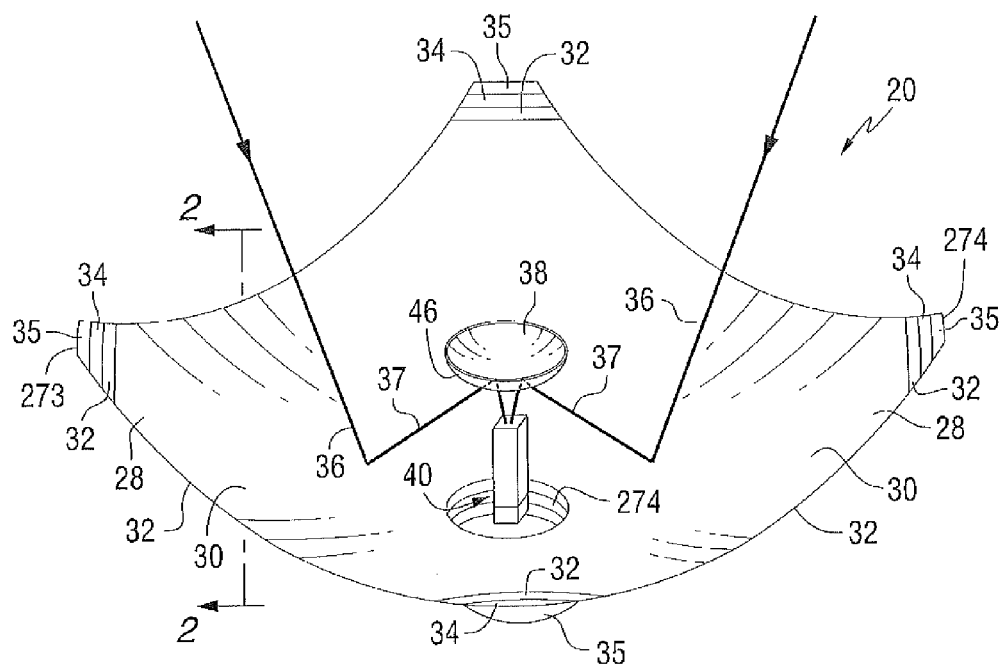
FIG. 1 is an isometric view of a parabolic solar mirror having a protective film applied in accordance to the teachings of the invention.

As used herein, unless otherwise expressly specified, all numbers such as those expressing values, ranges, amounts or percentages may be read as if prefaced by the word "about", even if the term does not expressly appear. When referring to any numerical range of values, such ranges are understood to include each and every number and/or fraction between the stated range minimum and maximum. For example, a range of "1 to 10" is intended to include all sub-ranges between (and including) the recited minimum value of 1 and the recited maximum value of 10, that is, having a minimum value equal to or greater than 1 and a maximum value of equal to or less than 10. As employed herein, the term "number" means one or an integer greater than one. Also, as used herein, the terms "over", "moved over", "applied over" and "deposited over" means moved, applied, and deposited on, but not necessarily in surface contact with. For example, one surface, article, film or component "moved over" "applied over" and "deposited over" another surface, article, film or component of an article or apparatus does not preclude the presence of materials between the surfaces of the articles, or between components of the article or apparatus, respectively. Further, as used herein, the terms "on", "moved on", "applied on" and "deposited on" means in surface contact with.

Before discussing non-limiting embodiments of the invention, it is understood that the invention is not limited in its application to the details of the particular non-limiting embodiments shown and discussed herein since the invention is capable of other embodiments. Further, the terminology used herein to discuss the invention is for the purpose of description and is not of limitation. Still further, unless indicated otherwise, in the following discussion like numbers refer to like elements.

As used herein, plural phrases or terms encompass their singular counterparts and vice versa, unless specifically stated otherwise. By way of illustration, and not limitation to the invention, although reference is made herein to "an" electrodepositable coating composition, and "a" liquid material, "an" ionic compound; a plurality of these materials can be used in the present invention. As used herein, "plurality" means two or more.

As used herein, the term "includes" and like terms means "including without limitation."

As used herein, the use of "or" means "and/or" unless specifically stated otherwise, even though "and/or" may be explicitly used in certain instances.

As used herein, the term "cure" and "cured" refers to a process wherein the crosslinkable components of a coating are at least partially crosslinked. In certain embodiments, the crosslink density of the crosslinkable components (i.e., the degree of crosslinking) ranges from 5% to 100%, such as 35% to 85%, or, in some cases, 50% to 85% of complete crosslinking. One skilled in the art will understand that the presence and degree of crosslinking, i.e., the crosslink density, can be determined by a variety of methods, such as dynamic mechanical thermal analysis (DMTA) using a Polymer Laboratories MK III DMTA analyzer conducted under nitrogen.

Reference to any monomer(s) herein refers generally to a monomer that can be polymerized with another polymerizable component such as another monomer or polymer. Unless otherwise indicated, it should be appreciated that once the monomer components react with one another to form a compound, the compound will include the residues of such monomer components.

The present invention is directed to a method for depositing an electrodepositable protective coating composition, e.g. but not limited to an organic protective coating over an electrically conductive surface of a reflective coating of a solar mirror. Unlike substrates that have been coated by a conventional flow coating method, the electrically conductive surface of the reflective coating of the solar mirrors that are coated using the method disclosed herein lack the contact points described above in the section titled "Discussion of the Presently Available Technology". That is, the electrically conductive surfaces of the solar mirrors that are coated pursuant to the method of the invention disclosed herein are not grounded by a mechanical contact and, therefore, are substantially free of uncoated contact areas.

The invention is not limited to the shape of the solar mirror, and any of the shapes known in the art can be used in the practice of the invention, e.g. but not limited to a flat solar mirror, a trough shaped solar mirror and a parabolic shaped solar mirror. Shown in FIG. 1 is a non-limiting embodiment of a parabolic shaped solar mirror 20 having a transparent substrate 28, e.g. but not limiting to the invention, a soda-lime-silicate glass having a first surface 30 facing the sun (not shown), and an opposite surface or second surface 32 (clearly shown in FIG. 2). In the non-limiting embodiment of the solar mirror 20 shown in FIG. 1, the first surface 30 is a concave surface, and the second surface 32 is a convex surface. A reflective coating, layer or film 34 is applied to the second surface 32 of the substrate 28 to reflect the sun's rays, e.g. but not limiting to the invention, in the manner discussed below. The solar reflective film 34 is not limiting to the invention and can be any of the types used and/or known in the art, e.g. but not limited to silver, aluminum, nickel, stainless steel or gold sheets adhered to the second surface 32, and reflective coatings applied to the second surface 32, of the substrate 28. The reflective coating can be applied to the second surface 32 of the substrate 28 in any usual manner, e.g. but not limited to spray coating, electroless coating, roll or brush painting, wet chemical coating application, chemical vapor deposition, and magnetron sputtering vacuum deposition ("MSVD"). A protective coating or film 35 (clearly shown in FIG. 2) is applied over the reflective coating 34 in accordance to the invention.

As can be appreciated, the invention is not limited to the manner in which the substrate 28 is shaped and coated, and any of the methods known in the art can be used in the practice of the invention. For example and not limiting to the invention, the solar mirror 20 can be made as disclosed in U.S. patent application Ser. No. 12/709,091 filed on Feb. 19, 2010 in the name of James P. Thiel and titled A SOLAR REFLECTING MIRROR AND METHOD OF MAKING SAME, and in U.S. patent application Ser. No. 12/709,045 filed on Feb. 19, 2010 in the names of Abhinav Bhandari et al and titled SOLAR REFLECTING MIRROR HAVING A PROTECTIVE COATING AND METHOD OF MAKING SAME. The forgoing patent applications in their entirety are hereby incorporated herein by reference.

Figure 2:
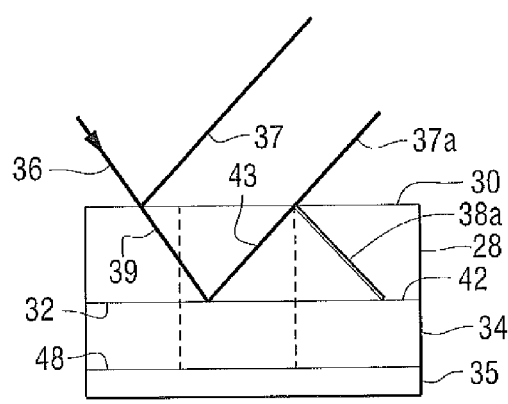
FIG. 2 is a view taken along lines 2-2 of FIG. 1.

With continued reference to FIGS. 1 and 2 as needed, the parallel solar energy rays represented by ray 36 in FIGS. 1 and 2 is incident on the concave surface 30 of the shaped glass substrate 28. The solar energy rays are shown in FIGS. 1 and 2 as one ray 36 for purpose of clarity and simplicity instead of the infinite number of parallel solar energy rays incident on the concave surface 30. A portion 37 of the ray 36 is reflected from the concave surface 30 of the mirror 20 to a secondary mirror 38 (shown only in FIG. 1), and a portion 39 of the ray 36 passes through the first surface 30, and through the transparent substrate 28, and is reflected from surface 42 (FIG. 2) of the reflective film 34 as reflected ray 43 back through the glass substrate 28. A portion of the reflected ray 43 passes through the surface 30 as ray 37a toward the secondary mirror 38, and a portion 38a of the ray 43 is reflected from the first surface 30 through the glass substrate 28 to the second surface 32. Internally reflected light rays within the body of a glass substrate are well known in the art and no further discussion is deemed necessary. For a detailed discussion of internally reflected light rays within a glass body, reference can be made to above-mentioned U.S. patent application Ser. No. 12/709,045. In the embodiment of the invention shown in FIG. 1, the rays 37 are incident on the secondary mirror 38 positioned at the focal point or focal area of the shaped mirror 20. The rays 37 are incident on the secondary mirror 38 and are reflected from the secondary mirror 38 to an energy converter 40. In another embodiment of the invention, the energy converter 40 is positioned at the focal point or focal area of the shaped solar mirror 20 thereby eliminating the need for the secondary mirror 38.

As can be appreciated the invention is not limited to the energy converter 40, and the converter 40 can be any of the types used and/or known in the art to receive solar energy and convert the solar energy to electric energy, thermal energy or chemical energy.

With continued reference to FIG. 1, in non-limiting embodiments of the invention, the secondary mirror 38 can be a flat mirror or a mirror having a radiused surface. The reflected solar rays 37 from the mirror 20 impinge on major surface 46 of the secondary mirror 38 and are reflected from the secondary mirror 38 to the energy converter 40 in a similar manner as the rays 37 are reflected from the primary mirror 20 to the secondary mirror 38.

In the practice of the invention, the protective film or coating 35 (see FIG. 2) is provided over outer surface 48 of the reflective coating 34 to protect the reflective coating 34 against mechanical damage and chemical damage. As is appreciated by those skilled in the art, the solar reflective coating 34 is usually an electrically conductive coating because the solar reflective coatings usually include a metal coating, a metal layer, or one or more metal films. In the event, the surface 48 of the reflective coating 34 is not an electrically conductive surface, e.g. the surface 48 is an electrically insulating surface, an electrically conductive film can be applied in any usual manner over or on the reflective coating 34 to provide an electrically conductive surface, e.g. a conductive surface can be applied over the reflective coating by adhering a metal sheet to the reflective coating 34, and a metal film can be deposited over the reflective coating by spray coating, electroless coating, roll or brush painting, wet chemical coating application, chemical vapor deposition, and MSVD.

In general, the method of the present invention includes applying the protective coating 35 over the electrically conductive surface 48 of the reflective coating 34 by simultaneously applying a plurality of liquid materials onto different portions or areas of the conductive surface 48 of the reflective coating 34 and maintaining the liquid materials on the conductive surface spaced from one another and preferably, but not limiting to the invention, out of contact with one another. At least two of the liquid materials used in the practice of the invention are electrically conductive. Moreover, at least one of these electrically conductive liquid materials includes an ionic compound that is to be deposited onto the conductive surface 48 of the substrate 28 of the solar mirror 20. When a complete electrical circuit is desired, each of the conductive liquid materials are applied to the conductive surface 48 in the form of a continuous stream, and an electrical circuit is applied to a conductive flow dispenser through which the liquid materials flow, such as a pipe or nozzle which is electrically connected or bonded to a direct current rectifier, thereby forming an electrical circuit. That is, the conductive liquid materials and the conductive surface form a complete circuit when an electrical potential is applied to the system.

In some embodiments, a first liquid stream, which can include an ionic compound that is to be deposited onto the conductive surface or substrate, is applied onto one area of the conductive surface 48 while a second liquid stream is simultaneously applied onto a different area of the conductive surface. In order to form an electrical circuit, each of these streams would be electrically conductive. Moreover, so long as these streams are simultaneously and continuously applied to the conductive surface and spaced from one another, an electrical charge can be applied to one of the streams thereby depositing the ionic compound onto the electrically conductive surface 48 of the reflective coating 34 of the solar mirror 20 as described above.

While the preceding paragraphs describe situations where a first and second liquid stream is used in the process, the present invention can also be used in a manner where multiple sets of liquid streams are used. For example, the first and second liquid streams described above can be characterized as a set. Accordingly, in some embodiments of the present invention, multiple sets can be used. That is, in certain embodiments, the present invention can have a plurality of liquid streams that form a first set and a plurality of streams that form a second set. In these embodiments, the second set would be downstream from that of the first set. Accordingly, the first set can include the first and second liquid streams described in the preceding paragraph while the second set can include a third liquid stream as well as a fourth liquid stream. The third and fourth liquid streams would be similar to the first and second liquid streams in that they would be electrically conductive. Moreover, either the third and fourth liquid streams can include the ionic compound as described above. Depending on the user's needs and/or requirements, any number of sets can be used in the present invention.

While the present invention is generally described as applying a plurality of electrically conductive liquid materials simultaneously onto different portions of a conductive surface 48, it is noted that a non-electrically conductive liquid material, such as deionized water, can also be applied onto the substrate simultaneously with the electrically conductive liquids. For instance, the non-electrically conductive liquid material can be applied onto the conductive surface at a location that is either upstream or downstream from the first and/or second liquid streams, or it can be applied onto the conductive surface of the substrate at a location that is in between the first and second liquid streams. The uses of the non-electrically conductive liquid material can vary, but deionized water, for example, can be used in order to wash at least a portion of the substrate prior to or after the first liquid stream. Since the non-electrically conductive liquid material cannot conduct an electrical charge, the electrical circuit still flows through the first liquid stream, the conductive surface of the reflective coating, and the second liquid stream.

As stated above, one or more of the electrically conductive liquids described above includes an electrodepositable coating composition or electrocoat coating composition. The invention is not limited to the composition of the protective coating, and any coating that can be electrodeposited would provide some degree of protection. In the preferred practice of the invention, the protective coating provides protection against expected chemical attack, e.g. from the environment and expected mechanical attack, e.g. from scratches and impact abrasion. Suitable electrodepositable coating compositions known in the art can be used in the present invention. In general, the electrodepositable coating composition includes a film-forming polymer and a curing agent that is capable of reacting with the film-forming polymer. A wide variety of film-forming polymers can be used so long as the film-forming polymers are "water dispersible." As used herein, "water dispersible" means that a material is adapted to be solubilized, dispersed, and/or emulsified in water. Examples of film-forming polymers suitable for use in the present invention, without limitation, include resins or polymers derived from a polyepoxide, an acrylic, a polyurethane, a polyester, or combinations thereof. In certain embodiments, the film-forming polymer can include functional groups. As used herein, "functional groups" or "reactive functional groups" mean hydroxyl, carboxyl, carbamate, epoxy, isocyanate, aceto acetate, amine-salt, mercaptan, or combinations thereof. The film-forming polymer described above is also ionic in nature. Specifically, the film-forming polymers can be cationic or anionic. Therefore, in some embodiments, the film-forming polymer can include cationic salt groups, generally prepared by neutralizing a functional group on the film-forming polymer with an acid, which enables the film-forming polymer to be electrodeposited onto a cathode. For example, in some embodiments, a film-forming cationic polymer can be derived by first reacting a polyepoxide containing polymer with an amine, such as those described above, 1,5,7-triazabicyclo[5.5.0]dec-5-ene (TBD), sulfides, or combinations thereof, then reacting the polymer with an acid. Depending on the compound that is used to react with the epoxy functional polymer, the acid can either be added to the polymer after the polymer has been reacted with the amine, TBD, and/or sulfide or it can be added to the polymer in combination with these compounds. In certain embodiments, the "ionic compound" means the ionic film-forming polymer described above.

The electrodepositable coating composition that can be used in the practice of the invention can also include a curing agent or crosslinking agent that is reactive towards that film-forming polymer described in the preceding paragraph. For example, the curing agent can include moieties that are reactive with the functional groups of the film-forming polymer. Suitable crosslinking agents that can be used include, without limitation, aminoplasts, polyisocyanates (including blocked isocyanates), polyepoxides, beta-hydroxyalkylamides, polyacids, anhydrides, organometallic acid-functional materials, polyamines, polyamides, cyclic carbonates, siloxanes, or combinations thereof. In some embodiments, the curing agent can include from 30 weight % to 40 weight % based on the total resin solids of the electrodepositable coating composition.

In certain embodiments, the electrodepositable coating composition can further include a curing catalyst which can be used to catalyze the reaction between the crosslinking agent and the film-forming polymer. Suitable curing catalysts that can be used in the present invention include, without limitation, organotin compounds (e.g., dibutyltin oxide, dioctyltin oxide) and salts thereof (e.g., dibutyltin diacetate); other metal oxides (e.g., oxides of copper, manganese, cerium, zirconium and/or bismuth) and salts thereof (e.g., bismuth sulfamate and/or bismuth lactate), a cyclic guanidine (as described in paragraphs [0010] to [0015] of U.S. Patent Publication No. 2009/0042060, the entire disclosure being incorporated herein by reference), or combinations thereof.

As described above, the present invention includes simultaneously applying a plurality of conductive liquid materials to different portions of the conductive surface 48 of the reflective coating 34. While one of the liquid materials (e.g., first liquid stream or second liquid stream) can include the electrodepositable coating composition described in the preceding paragraphs, the other liquid material (e.g. second liquid stream or first liquid stream) can include any liquid material so long as it is electrically conductive. For example, water (not deionized water, but electrically conductive water) or permeate can be used as the other liquid material. Permeate, can generally be described as the remnants of an electrodeposition bath after the bath has undergone ultrafiltration. Accordingly, permeate can include a small portion of the film-forming polymer described above. One skilled in the art of electrodeposition will recognize what is meant by permeate. Therefore, a detailed description of that material will not be set forth herein.

In some embodiments, the first liquid stream includes an electrodepositable coating composition while the second liquid stream includes water or permeate. Alternatively, the first liquid stream can include water or permeate while the second liquid stream includes the electrodepositable coating composition. In these embodiments, the first and second liquid streams can include ionic charges that are opposite to one another. For example, if the electrodepositable coating composition that is used for the first stream includes a positive charge (i.e., the first stream is cathodic), then the water or permeate that is used for the second stream includes a negative charge (i.e., the second stream is anodic). Alternatively, if the electrodepositable coating composition includes a negative charge, then the water or permeate can include a positive charge.

The various liquid materials (e.g., electrodepositable coating composition, water, permeate) described above can be applied to the conductive surface using techniques that are known in the art. For example, the various liquid materials can be sprayed applied onto the conductive surface of the substrate, or the substrate can flow through a curtain of the liquid materials or stream of liquid materials. Accordingly, a spray nozzle, pipe nipple, or any other type of aperture (e.g., slit) can be used in the apparatus to apply the liquid materials onto the conductive surface 48 of the reflective coating 34. It should be noted that the process parameters for applying the various liquid materials onto the conductive surface can be dependent upon the shape of the solar mirror and, therefore, different types and shapes of apertures and/or nozzles can be used to apply the liquid materials onto the conductive surface 48 of the solar mirror being coated.

The thickness on which the electrodepositable coating composition is deposited onto the conductive surface will be dependent upon the user's needs, e.g. the degree and extent of exposure of the solar mirror to the hostile environment. For example and not limiting to the invention, the longer the exposure and/or the more hostile the environment, it is preferred to increase the thicker the electrodepositable coating composition deposited over the reflective coating. In some embodiments of the inventions, the wet and/or dry film thickness of the coating will range from 0.5 micron to 150 microns, and more preferably from 25 microns to 150 microns.

In some embodiments of the invention, facilities for curing the electrodepositable coating composition can be positioned in the process such that the electrodepositable coating composition is substantially or completely cured after the coating composition is deposited onto the conductive surface. For example, in certain embodiments, a UV lamp can be positioned between the first and second streams such that a UV curable electrodepositable coating composition that is being deposited onto the conductive surface from the first stream is substantially and/or completely cured prior to the coating reaching the second stream. In other embodiments, the UV lamp can be positioned after the station with the second stream thereby curing the electrodepositable coating composition after it has exited the station, for example, the permeate station. While the preceding embodiment of the invention described a UV lamp as being used to cure the electrodepositable coating composition, other methods for curing the coating composition can be used depending on the particular chemistry of the electrodepositable coating composition. For instance and not limiting to the discussion, thermal heating/ energy, infrared radiation, induction heating, electron beam radiation, and/or ionizing or actinic radiation can be used to cure the electrodepositable coating composition. In certain embodiments, the curing operation can be carried out at ambient temperatures. In other embodiments, the curing operation can be carried out at temperatures equal to or less than 260° C. In certain embodiments, the curing operation can be carried out at temperatures ranging between any combination of values less than 260° C. For example, the curing operation can be carried out at temperatures ranging from 120° C.-150° C. It should be noted, however, that lower or higher temperatures can be used as necessary to activate the curing mechanisms.

In other embodiments, an air knife can be positioned upstream, downstream, or between the first and/or second streams in order to substantially dry at least a portion of the substrate. Further, an air knife can be positioned between the first and second streams to maintain the streams spaced from one another, and preferably, but not limiting to the invention, out of contact with one another on the conductive surface 48 to pass the electric current through the conductive surface 48 of the reflective coating 34 to coat the conductive surface having the electrodepositable coating composition thereon and to prevent contamination of the liquids from the first and the second streams.

While any number of methods can be used to convey the solar mirror through the various liquid materials described above, it is noted that the actual apparatus used to convey the solar mirror does not ground the conductive surface 48 of the reflective coating 34, nor is it electrically bonded or connected with the electrical source, e.g., a rectifier. In other words, any apparatus can be used in the practice of the invention to convey the solar mirror through the liquid materials so long as the portion of the apparatus that contacts the conductive surface is electrically isolated from the conductive surface being coated, e.g. but not limited to the discussion, the portion of the apparatus that contacts the conductive surface 48 is non-conductive nor grounded or electrically connected to an apparatus that is grounded. More particularly, in certain embodiments, the solar mirror can be placed on a plurality of rollers which would convey the solar mirror through the various liquid materials. These rollers can be made entirely of plastic or they can include a plastic shell that surrounds a metallic core. In this embodiment, the plastic shell is the portion of the roller that contacts the solar mirror and depending on the shape of the solar mirror, which contacts the conductive surface. Additionally, the solar mirror can be conveyed through the liquid materials in a manner such that the conductive surface of the solar mirror that is being coated with the liquid materials is not in contact with any other object as it passes through the liquid materials. This might be accomplished by placing a roller that unwinds a coiled metal substrate, such as a metallic sheet (e.g., sheet stock), upstream from the first liquid stream while a roller that coils or winds the metallic sheet into a coil is placed downstream from the second liquid stream. In situations where the conductive surface being coated is on a cylindrical shaped surface of a solar mirror, conveying facilities can be used that rotate the solar mirror to rotate the conductive surface as the solar mirror passes through at least one set of liquid streams thereby coating the entire cylindrical conductive surface of the solar mirror.

It is also understood that, in some embodiments of the invention, the reflective coating 34 can include films of different metals. Although not limiting to the invention, to prevent galvanic action between the different metals of the reflective coating 34, a sacrificial metal film can be provided on or over the reflective coating 34. Any metals used and/or known in the art as sacrificial metals, e.g. but not limited to zinc, aluminum, tin and iron can be used in the practice of the invention. In the preferred practice of the invention a zinc film is used, e.g. as described in U.S. Pat. Nos. 4,793,867 and 5,588,989, which patents are hereby incorporated by reference.

While the electrodepositable coating composition described above need not be topcoated with additional coating compositions, in certain embodiments of the invention, the electrodepositable coating composition can be used in a coating system. The coating system can include, but is not limited to a number of coating layers. A coating layer is typically formed when a coating composition that is deposited onto the reflective coating 34 is substantially cured by methods known in the art (e.g., by thermal heating or UV curing).

In one non-limiting embodiment of the invention, a color imparting coating composition (hereinafter, a "basecoat") is applied onto the outer surface, e.g. the conductive surface 48 of the reflective film 34 and the protective film 35 applied to the basecoat. The basecoat can contain colorants which can absorb or reflect ultraviolet radiation, e.g. wavelengths less than 300 nanometers ("nm") of the electromagnetic spectrum, that may pass through the reflective coating 34 to protect the protective film 35 against ultraviolet degradation in those instances when the protective film 35 is susceptible to ultraviolet degradation. In another non-limiting embodiment of the invention, the basecoat can have a white colorant (alone or in combination with the ultraviolet radiation protective colorants) to reflect any wavelengths in the range of equal to and greater than 300 nm that may pass through the reflective coating 34.

In another non-limiting embodiment of the invention, a substantially clear coating composition (hereinafter, "clearcoat") can be deposited onto at least a portion of the basecoat coating layer for aesthetics. For example, the clearcoat coating composition can be of the type described in U.S. Pat. Nos. 5,989,642; 6,245,855; 6,387,519 and 7,005,472, which patents are hereby incorporated by reference.

As can be appreciated, the basecoat and/or clearcoat described in the preceding paragraphs can include colorants and/or other optional materials, which are known in the art of formulated surface coatings. As used herein, the term "colorant" means any substance that imparts color and/or other opacity and/or other visual effect to the composition. The colorant can be added to the coating in any suitable form, such as discrete particles, dispersions, solutions and/or flakes (e.g., aluminum flakes). A single colorant or a mixture of two or more colorants can be used in the coating composition described herein. In general, the colorant(s), pigment(s) and/or additive(s) can be present in any amount sufficient to impart the desired visual and/or color effect.

One or more of the coating compositions described herein can include other optional materials well known in the art of formulated surface coatings, such as plasticizers, anti-oxidants, hindered amine light stabilizers, ultraviolet light absorbers and stabilizers, surfactants, flow control agents, thixotropic agents such as bentonite clay, pigments, fillers, organic cosolvents, catalysts, including phosphoric acids and other customary auxiliaries.

In addition to the materials described above, one or more of the coating composition described above can also include an organic solvent. Suitable organic solvents that can be used in the coating composition include, but are not limited to, any of those listed in the preceding paragraphs as well as butyl acetate, xylene, methyl ethyl ketone, or combinations thereof.

It will be further appreciated that one or more of the coating compositions that form the various coating layers described herein can be either "one component" ("1K"), "two component" ("2K"), or even multi-component compositions. A 1K composition will be understood as referring to a composition wherein all of the coating components are maintained in the same container after manufacture, during storage, etc. A 2K composition or multi-component composition will be understood as referring to a composition wherein various components are maintained separately until just prior to application. A 1K or 2K coating composition can be applied to a conductive surface and cured by any conventional means, such as by heating, forced air, and the like.

The pretreatment solution, primer-surfacer, basecoat, and/or clearcoat can be deposited or applied onto or over the conductive surface 48 of the reflective coating 34 using any technique that is known in the art. For example, the coating compositions can be applied by any of a variety of methods including, without limitation, spraying, brushing, dipping, and/or roll coating, among other methods. When a plurality of coating compositions are applied onto the conductive surface 48 of the reflective coating 34, it should be noted that one coating composition can be applied onto at least a portion of an underlying coating composition either after the underlying coating composition has been cured or prior to the underlying coating composition being cured. If the coating composition is applied onto an underlying coating composition that has not been cured, both coating compositions can be cured simultaneously.

The basecoat, and/or clearcoat can be cured using the methods described above. However, in certain embodiments, one or more of these coating compositions can be a low temperature, moisture curable coating compositions. As used herein, the term "low temperature, moisture curable" refers to coating compositions that, following application to the conductive surface of the reflective coating, are capable of curing in the presence of ambient air, the air having a relative humidity of 10% to 100%, such as 25% to 80%, and a temperature in the range of −10° C. to 120° C., such as 5° C. to 80° C., in some cases 10° C. to 60° C. and, in yet other cases, 15° C. to 40° C.

EXAMPLES

The following examples disclose and teach various non-limiting embodiments of the present invention to deposit an electrodepositable protective coating composition over the reflective coating 34 of solar mirrors through the use of a plurality of electrically conductive liquid streams or flow curtains.

Non-limiting embodiments of EXAMPLE 1 of the invention are presented in the following discussion. With reference to FIGS. 3 and 3A, there is shown a flat solar mirror 70 including a flat glass substrate 72 having the reflective coating 34 on surface 76 of the glass substrate 72. The flat solar mirror 70 of FIG. 3 can be used as a secondary mirror to reflect solar rays from the concave surface of a parabolic mirror 20 to the energy converter 40 (see FIG. 1), or in an array of solar mirrors to reflect solar energy to one or more designated areas. The use of flat solar mirrors is well known in the art and no further discussion regarding the use of flat solar mirrors to reflect solar energy is deemed necessary. The invention is not limited to the peripheral shape or size of the solar mirror 70. In this non-limiting embodiment of the invention, the mirror 70 has a rectangular shape, and the glass substrate has a thickness of 3.2-4.0 millimeters. With reference to FIG. 3A, the reflective coating 34 in this non-limiting embodiment of the invention includes a silver film or layer 78 adhered to the surface 76 of the glass substrate 72; a nickel containing film or layer 80 on or over the silver film 78; a titanium dioxide film or layer 82 on or over the nickel containing film 80; a zinc stannate film or layer 84 on or over the titanium dioxide film 82, and a permanent protective overcoat ("PPO") film or layer 86 on or over the zinc stannate film 84. In the practice of the invention, it is preferred that the reflective coating 34 has a visible light transmission in the range of 300 to 700 nm of the electromagnetic spectrum of equal to or less than 5%, and for purposes of the invention is the coating is considered opaque to visible light. In the practice of the invention a surface or coating that is not an electrically insulating surface is considered an electrically conductive surface or coating. The films 78, 80, 82 and 84 of the reflective coating 34 can be applied by the MSVD coating process. A discussion of the films 78, 80, 82 and 84 of the reflective coating 34 and additional coatings can be found in U.S. patent application Ser. No. 12/330,580 filed on Dec. 9, 2008 and titled REFLECTIVE COATING, which patent application in its entirety is hereby incorporated by reference.

The PPO film 86 is applied by MSVD and includes oxides of silicon and aluminum. A detailed discussion of the PPO film is presented in U.S. Pat. No. 6,916,542, which patent in its entirely is incorporated herein by reference. The PPO film protects the reflective coating 34 against scratches and impact abrasion during storage, handling and shipping the glass having the reflective coating 34.

To eliminate or reduce galvanic action between the films of the conductive coating 34, a metal film or layer 88, e.g. a zinc film or layer 88 was provided on or over the PPO film 86. In the following discussion, the reflective coating 34 unless indicated otherwise includes, but is not limited to, the silver film 78, the nickel film 80, the titanium dioxide film 82, the nickel film 80, the zinc stannate film 84, the PPO film 86 and the zinc film 88. Further in the following discussion, the conductive surface 48 of the reflective coating 34 is the outer surface of the metal film 88, e.g. the zinc film 88; in other words, the surface of the zinc film 88 more distance from the substrate 72 (see FIG. 3A). As is appreciated, the invention contemplates providing a protective layer over a solar reflective coating that does not include the metal film, e.g. the zinc film 88 to reduce or eliminate galvanic action.

Shown in FIGS. 4 and 5 is a coating station 100 that can be used in the practice of the invention to apply the protective coating 35 on or over the conductive surface 48 of the reflective layer 34 in accordance with the teachings of the invention. The coating station 100 includes a conveyor 102 for moving the solar mirror 70 having the reflective coating 34 in the direction of arrow 106 under a non-limited embodiment of an electric flow coating arrangement 108 of the invention positioned above the conveyor 102 and into curing station 110. The conveyor 102 includes plastic conveyor rollers 112 having opposed ends 114 and 116 mounted on horizontal beams 118 and 120, respectively and connected to a gearing arrangement powered by a motor, as is known in the art, to move the solar mirror 70 in the direction of the arrow 106 (gear arrangement and motor not shown in FIGS. 4 and 5). The horizontal beams 118 and 120 are supported above floor 122 (numbered only in FIG. 4) by vertical struts 124 and 126 (shown only in FIG. 4).

Figure 6:
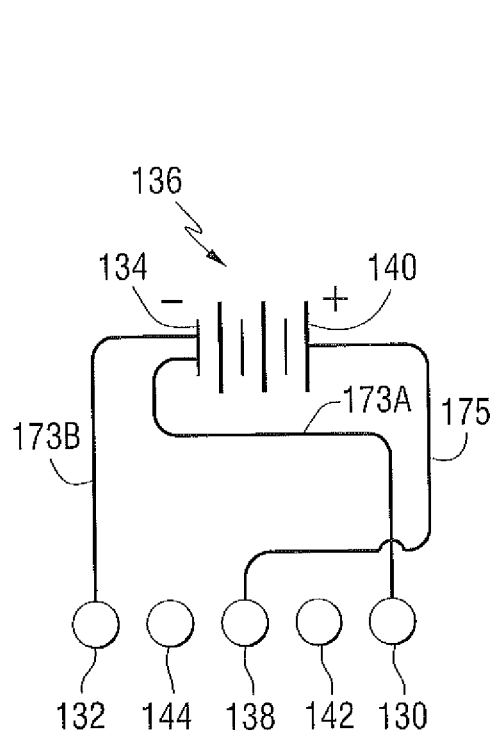
FIG. 6 is a schematic of an electrical system that can be used in the practice of the invention.

The electric flow coating arrangement 108 includes curtain flow conduits 130 and 132 connected to a terminal 134, e.g. negative terminal 134 of direct current rectifier 136, e.g. a 500 volt DC rectifier, and curtain flow conduit 138 connected to other terminal 140, e.g. the positive terminal 140 of the rectifier 136 (see FIG. 6). As can be appreciated the curtain flow conduits 130 and 132 can be connected to the positive terminal 140 of the rectifier 136, and the curtain flow conduit 138 can be connected to the negative terminal 134 of the rectifier 136. In the practice of the invention, it is preferred to move the electrodepositable protective coating composition through the middle conduit, i.e. the conduit 138 for ease of collecting the electrodepositable coating composition as discussed below; however, the invention contemplates moving the electrodepositable coating composition through the outer conduits, i.e. the conduits 130 and 132. With the electrical arrangement shown in FIG. 6, a cationic electrodepositable protective coating composition is moved through the conduit 138, e.g. but not limited to Powercron® 935 cationic acrylic electrocoat paint from PPG Industries, Inc. Further, the invention contemplates connecting the conduits 130 and 132 to the positive terminal 140 and the conduit 138 to the negative terminal 134.

A conduit 142 for providing a first air knife is mounted between the curtain flow conduits 130 and 138, and a conduit 144 for providing a second air knife is mounted between the curtain flow conduits 132 and 138. The first air knife provided by the conduit 142 maintains the fluids from the flow curtain conduits 130 and 138 on the conductive surface 48 out of contact with one another, and the second air knife provided the conduit 144 maintains the fluids from the flow curtain conduits 132 and 138 on the conductive surface 48 out of contact with one another.

Figure 8:
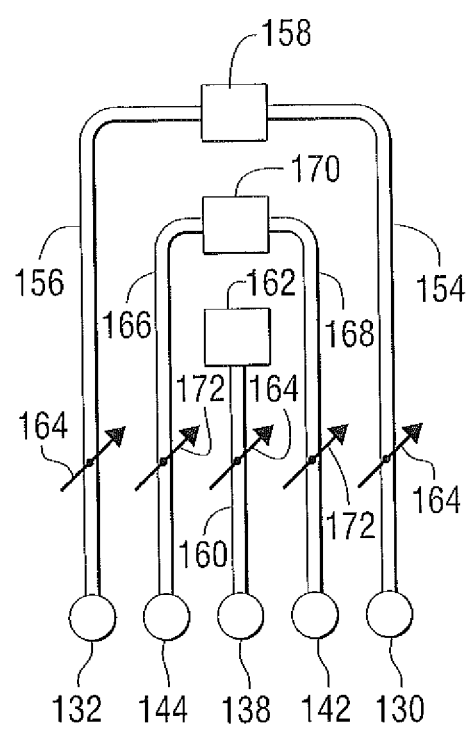
FIG. 8 is a schematic of a fluid supply system that can be used in the practice of the invention.
Figure 7:
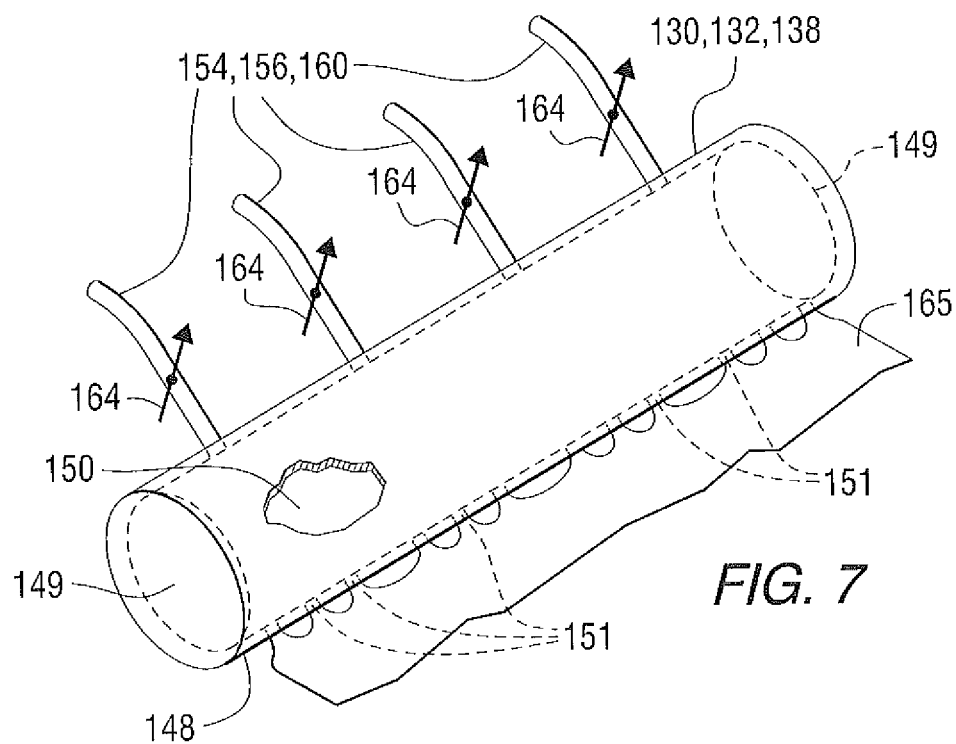
FIG. 7 is an isometric view of a conduit having portions removed for purposes of clarity that can be used in the practice of the invention to provide a coating flow curtain.

With reference to FIGS. 6-8 as needed, each of the flow curtain conduits 130, 132 and 138 include an elongated metal pipe 148 having closed ends 149 to provide an interior chamber 150 and having a series of holes or slots 151 drilled in a straight line along the length of the pipe 148. The holes 151 can have a diameter in the range 1 to 3 millimeters and preferably but not limiting to the invention a diameter of 1.5 mm. The conduits 130, 132 and 138 are mounted above the conveyor 102 with the holes 151 of the pipe 148 facing the conveyor 102. The chamber 150 of the pipes 148 of conduits 130 and 132 are connected by tubing 154 and 156, respectively to supply tank 158 (see FIG. 8) which has a conductive liquid capable of carrying an anodic charge from the rectifier 136 (see FIG. 6). Hereinafter the liquid capable of carrying an anodic charge, e.g. an anion containing liquid is also referred to as "an anionic liquid". As can be appreciated, the pipes 148 of the conduits 130 and 132 can be connected to a single supply tank 158 as shown in FIG. 8, or can each be connected to its individual supply tank as discussed below. The chamber 150 of the pipe 148 of the conduit 138 is connected by tubing 160 to a supply tank 162 (see FIG. 8); which has a conductive liquid capable of carrying a cationic charge from the rectifier 136 (see FIG. 6). Hereinafter, the liquid capable of carrying a cationic charge, e.g. a cationic containing liquid is also referred to as "a cationic liquid". Each of the tubings 152, 154 and 160 have a valve and/or pump 164 (see FIG. 7) to control the flow of the liquid into the chamber 150 to maintain a continuous flow curtain 165 from the holes or slits 151 of the pipe 148. The conduits 142 and 144 are connected by tubing 166 and 168 respectively to a pressurized air supply 170 (see FIG. 8) to provide an air knife or air curtain on the conductive surface 48 of the reflective coating 34. A flow valve and/or pump 172 is provided on each of the tubing 166 and 168 to provide an air curtain of sufficient pressure to maintain the electrically conductive liquids on the conductive surface 48 spaced from one another.

In one non-limiting embodiment of the invention the conduits 130, 132, and 138 are positioned above the rolls 112 of the conveyor 102 (see FIG. 4) such that the holes 151 of the pipes 148 of the conduits 130, 132 and 138 are in facing relationship to the rolls 112 of the conveyor 102 and are space within 25 millimeters ("mm") above the conductive surface 48 of the solar mirror 70 as it passes under the coating arrangement 108. The pumps 164 of the conduits 130 and 132 are adjusted to move the anionic fluid through the holes 151 of their respective pipe 148 at a flow rate of 0.1 to 5 gallons per minute per hole or slot, to provide the continuous anionic flow curtain 165 extending from the pipe 148 of the conduits 130 and 132 to the conductive surface 48. The cationic fluid is moved through holes 151 of the pipe 148 of the conduit 138 at a flow rate of 0.1 to 5 gallons per minute per hole or slot to provide a continuous cationic flow curtain 165 extending from the conduit 138 to the conductive surface 48 of the solar mirror 70. As can be appreciated by those skilled in the art as the volume of the chamber 150 and the area of the slots 151 increases the flow rate increases and vice versa. The conduits 142 and 144 providing the air curtains have a plurality of slots having a length of 5 to 50 mm and a width of 1 to 5 mm. The conduits 142 and 144 can have a plurality of slots spaced from one another or a single slot extending from one end of the conduit to the opposite end. The conduits 142 and 144 are spaced within 100 mm above the rolls 112 of the conveyor 102 such that the openings or nozzles of the conduits 142 and 144 are in facing relationship to the conveyor rolls 112 and are spaced within 25 mm of the conductive surface 48 as the solar mirror 70 moves under the conduits 142 and 144.

The longitudinal axis of the pipes 148 of the conduits 130, 132, 138, 142 and 144 are generally parallel to one another, with the longitudinal axis of the conduits on a center to center spacing as follows: the conduit 130 is spaced 3 to 12 inches (7.6 to 30 centimeters ("cm")) from the conduit 142; the conduit 142 is spaced 3 to 12 inches (7.6 to 30 cm) from the conduit 138; the conduit 138 is spaced 3 to 12 inches (7.6 to 30 cm) from the conduit 144, and the conduit 144 is spaced 3 to 12 inches (7.6 to 30 cm) from the conduit 32. The spacing arrangement discussed above is suitable for a mirror having a length in the range of 6 to 48 inches (15 cm to 1.2 meters). The length of the pipes 148 of the conduits is not limiting to the invention. In one non-limiting embodiment of the invention, the pipes 148 of the conduits 130, 132 and 138 have a length that is less than the length of the conveyor rolls 112, e.g. about 25% percent less. With the above arrangement a first electric path is provide from the rectifier 136 (see FIG. 6) to the pipe 148 of the conduit 130 by way of the wire 173A, through the electric flow curtain 165 of the conduit 130, through the conductive surface 48 of the reflective coating 48 of the solar mirror 70; through the electric curtain 165 of the conduit 138 and through the pipe 148 of the conduit 138 to the rectifier 136 by way of wire 175, and a second electric circuit from the rectifier 136 to the pipe 148 of the conduit 132 by way of wire 173B, through the electric flow curtain of the conduit 132, through the conductive surface 48 of the solar mirror 70; through the electric curtain 165 of the conduit 138 and through the conduit 138 to the rectifier 136 by way of the wire 175.

With reference to FIG. 4, a first polypropylene tank 190 having sloping collar or opening 192 is positioned under the conveyor rolls 112 of the conveyor 102. The opening 192 of the tank 190 preferably has a length that extends from a position upstream of the conduit 130 of the coating arrangement 108 to a position preferably below the air conduit 142, and a width about equal to the spacing of the horizontal beams 118 and 120 of the conveyor 102 to collect the anionic fluid from the conduit 130 that flows from the conductive surface 48. A second polypropylene tank 194 having sloping collar or opening 196 is positioned under the conveyor rolls 112 of the conveyor 102. The opening 196 of the tank 194 preferably has a length that extends from a position downstream of the conduit 132 of the coating arrangement 108 to a position preferably below the air conduit 144, and a width about equal to the spacing of the horizontal beams 118 and 120 of the conveyor 102 to collect the anionic fluid from the conduit 132 that flows from the conductive surface 48. A third polypropylene tank 198 having sloping collar or opening 200 is positioned under the conveyor rolls 112 of the conveyor 102 and between the tanks 190 and 196. The opening 200 of the third tank 198 preferably has a length that extends from the collar 192 of the first tank 190 to the collar 196 of the second tank 194, and a width about equal to the spacing of the horizontal beams 118 and 120 of the conveyor 102 to collect the cationic fluid from the conduit 138 that flows from the conductive surface 48 and does not adhere to the conductive surface 48. Preferably the tanks 190, 196 and 198 are placed in a polypropylene container 202 to collect fluids that are not contained in the tanks 190, 194 and 198.

In the practice of a non-limiting embodiment of the invention, the tank 198 collects POWERCRON® 935 cationic acrylic electrocoat paint (available from PPG Industries, Inc., Pittsburgh, Pa., USA), and the tanks 190 and 194 collect tap water of conductivity 450 µS. With reference to FIGS. 4, and 7-9 as needed, the solar mirror 70 having a length of 6 to 48 inches (15 cm to 1.2 meters) is placed on the conveyor rolls 112 with the conductive surface 48 facing the coating arrangement 108. The conveyor 102 is powered to move the solar mirror 70 in the direction of the arrow 106 toward the coating arrangement 108. As the leading edge 208 of the mirror 70 moves toward the conduit 130 the valve or pump 164 of the conduit 130 is activated to flow the anionic fluid through the openings 151 of the pipe 148 of the conduit 130 to form a flow curtain 210 of anionic fluid (see FIG. 9A) that moves toward the conveyor 102 and the conductive surface 48. As the solar mirror 70 continues to move in the direction of the arrow 106, toward the air conduit 142, the valve or pump 172 of the air conduit 142 is activated to move an air curtain 212 toward the conveyor 102. As the leading edge 208 of the solar mirror 70 moves under the air curtain 212 (see FIG. 9B), the air curtain 212 moves the anionic fluid over the conductive surface 48 in an upstream direction over the conductive surface 48 of the solar mirror 70. The solar mirror 70 continues to move in the direction of the arrow 106 to move the leading edge 208 of the solar mirror 70 toward the conduit 138 as the valve or pump 164 of the conduit 138 is opened or activated, respectively, to move the cationic fluid from the openings 151 of the pipe 148 of the conduit 138 to flow a curtain 214 of cationic fluid toward the conveyor 102. As the solar mirror 70 moves under the cationic flow curtain 214 from the conduit 138 (see FIG. 9C), the air curtain 212 moves the anionic fluid on the conductive surface 48 of the solar mirror 70 in an upstream direction and the cationic fluid in a downstream direction to maintain the anionic fluid and the cationic fluid on the conductive surface 48 spaced from and out of contact, e.g. electrical contact with one another to provide the first conductive circuit for the cationic fluid to deposit the electrocoat protective film 35 on the conductive surface 48 of the reflective coating 34 of the solar mirror 70.

The leading edge 208 of the mirror 70 continues to move in the direction of the arrow 106 toward the air conduit 144 as the valve or pump 172 is opened or activated, respectively, to move an air knife or curtain 216 toward the conveyor 102. As the leading edge 208 of the solar mirror 70 moves under the air curtain 216, the cationic fluid is moved in an upstream direction (see FIG. 9D) over the conductive surface 48. Continued movement of the solar mirror 70 moves the leading edge 208 toward the conduit 132 as the valve or pump 164 of the conduit 132 is opened or activated, respectively, to move anionic fluid through the openings 167 of the conduit 132 to provide anionic flow curtain 218 (see FIG. 9E). The air knife 216 moves the cationic fluid from the conduit 138 over the conductive surface 48 in an upstream direction and the anionic fluid from the conduit 132 in a downstream direction to maintain the anionic fluid and the cationic fluid on the conductive surface 48 spaced from and out of contact with one another to provide the second conductive circuit for the cationic fluid to deposit an the electrocoat protective film 35 (see FIG. 3A) on the conductive surface 48 of the solar mirror 70 (see FIG. 3A). As the leading edge 208 of the mirror 70 moves through the anionic flow curtain 218 of the conduit 132, the trailing edge 220 of the solar mirror 70 moves downstream of the conduit 130 shorting out the first electric circuit (see FIG. 9E) and away from the air conduit 142 (see FIG. 9F). The valve or pump 164 of the conduit 130 and the valve or pump 172 of the conduit 142 are closed or turned off, respectively (see FIG. 8).

As the trailing edge 220 of the solar mirror 70 having the protective film 35 of the invention moves past the conduit 138, the second circuit is shorted out, and the valve or pump 164 of the conduit 138, the valve or pump 172 of the conduit 144 and the valve or pump 164 of the conduit 132 are closed or turned off, respectively (see FIG. 9G). The mirror 70 is moved on the conveyor 102 into the curing station 110 (see FIG. 4). As can be appreciated, the invention contemplates having the valves or pumps of all or selected ones some of the conduits 130, 132, 138, 142 and 144 opened or turned on as the solar mirror 70 begins to move toward the coating arrangement 108. Further, the invention is not limited to a sensor arrangement that can be used to monitor the movement of the solar mirror 70 on the conveyor 102 as it moves toward and through the coating arrangement 108 to open and close the valves, or turn the pumps on and off, of selected ones of the conduits as discussed above, and any sensing and/or monitoring device known in the art can be used in the practice of the invention. Still further, the invention contemplates having the anionic fluid flowing from the conduit 138 and the cationic fluid flowing from the conduits 130 and 132.

Figure 10:
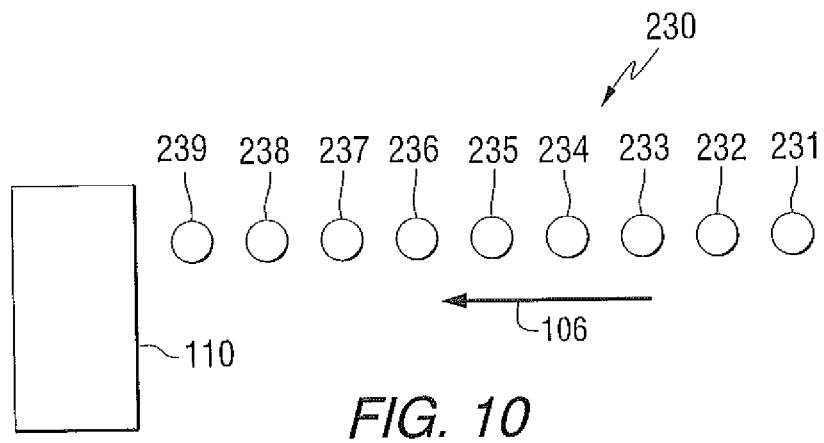
FIG. 10 is a side elevated view of another non-limiting embodiment of an arrangement of conduits for applying a protective film in accordance to the teachings of the invention over the reflective surface of a solar mirror.

Non-limiting embodiments of EXAMPLE 2 of the invention are presented in the following discussion. With reference to FIG. 10 there is shown a coating arrangement 230 having conduits 231-239. The conduits 231 and 239 direct a flow curtain of water, e.g. deionized water to rinse the conductive surface 48 of the solar mirror to be coated (the conduit 231) and to rinse the protective surface 35 deposited over the conductive surface 48 of the solar mirror (the conduit 239). Further, the invention contemplates using the conduit 231 to apply a surface treatment to the surface to be coated, e.g. but not limited to applying the zinc film 88 or a basecoat. Each of the conduits 232, 234 and 237 provide an air knife or curtain; each of the conduits 233 and 238 provide an anionic liquid curtain, and the conduits 235 and 236 provide cationic liquid curtains, or optionally each of the conduits 233 and 238 provide a cationic liquid curtain, and the conduits 235 and 236 provide an anionic liquid curtain. In still another non-limiting embodiment of the invention, the conduits 235 and 236 are spaced a distance apart greater than the length of the solar mirror to be coated such that the coating arrangement has two spaced coating areas.

Figure 12:
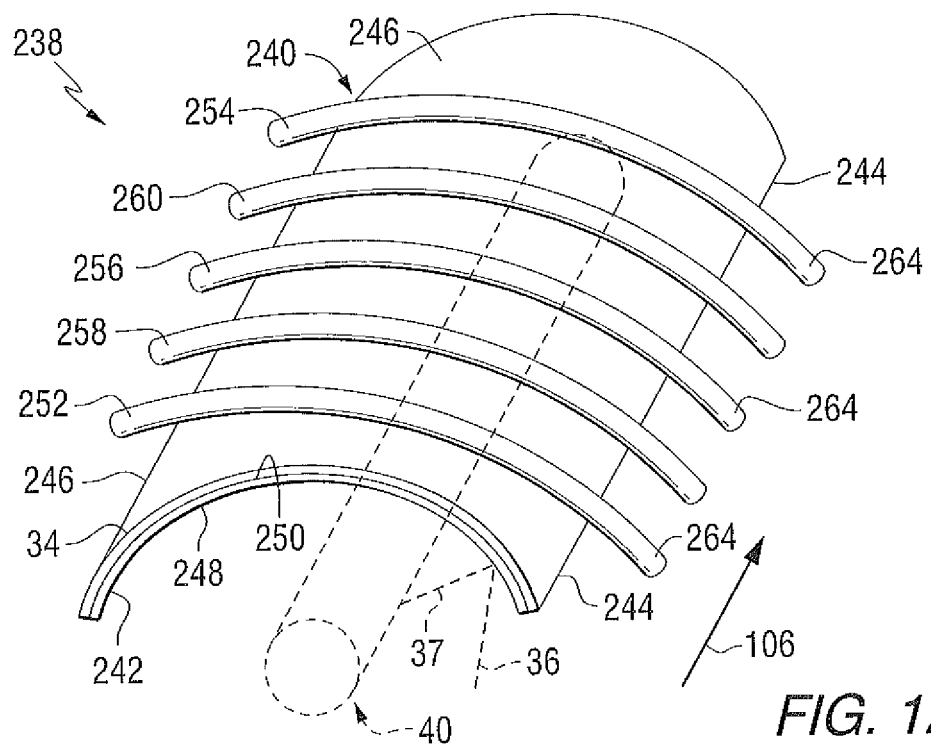
FIG. 12 is an isometric view of a coating arrangement to apply a protective film over a reflective coating of a shaped solar mirror in accordance to the teachings of the invention.

Non-limiting embodiments of EXAMPLE 3 of the invention are presented in the following discussion. The following non-limiting embodiments of EXAMPLE 3 of the invention use the coating station 100 described in the discussion of the non-limiting embodiments of EXAMPLE 1 and shown in FIGS. 4 and 5 with the following modifications. The coating arrangement 108 shown in FIGS. 4 and 5 is replaced with the coating arrangement 238 to coat solar trough mirror 240 shown in FIG. 12. The solar trough mirror 240 includes a trough shaped glass substrate 242 having a shaped cross section as shown in FIG. 12 and elongated opposed sides 244 and 246, a concave surface 248 and a convex surface 250. The reflective coating 34 (see also FIG. 3A) is over the convex surface 250, and the concave surface 248 is shaped to receive the sun's rays 36 and reflect the rays as the ray 37 toward the energy converter 40 as discussed above (the rays 36 and 37, and the converter 40 shown in phantom in FIG. 12).

Figure 11:
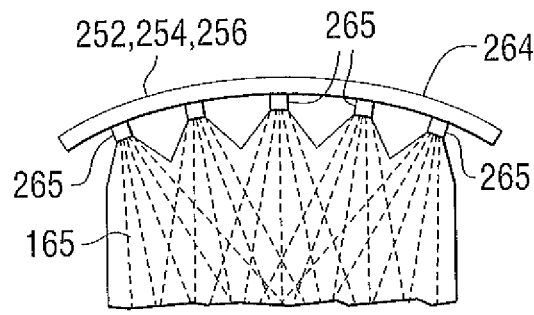
FIG. 11 is an elevated side view of a conduit used in the practice of the invention to provide a coating flow curtain in accordance to the teachings of the invention to apply a protective film over the reflective coating of a shaped solar mirror.

With reference to FIGS. 11 and 12 as needed, the coating arrangement 238 includes conduits 252 and 254 for directing the anionic or cationic fluid toward the conveyor 102 (conveyor 102 shown in FIGS. 4 and 5); conduit 256 for directing the cationic or anionic liquid, respectively toward the conveyor 102, and conduits 258 and 260 for directing the air curtain toward the conveyor 102. In this non-limiting embodiment of the invention, the cationic fluid moves through the conduits 252 and 254, and the conduits 252 and 254 are electrically connected to the positive terminal 134 of the rectifier 136, and the anionic fluid moves through the conduit 252, and the conduit 256 is electrically connected to the negative terminal 140 of the rectifier 136. The air knife conduits 258 and 260 are connected to the air supply 170 (see FIG. 8). Pipes 264 of the conduits 252, 254, 256, 258 and 260 are each shape to generally follow the contour the convex surface 250 of the glass substrate 242. With reference to FIG. 12, each of the pipes of the conduits 252, 254 and 256, and optionally the conduits 258 and 260 have a plurality of nozzles 265 (shown only in FIG. 11) directed toward the conveyor 102 to provide the flow curtain 165. The nozzles 265 for the conduits 252, 254 and 254 are on a center to center spacing of 1 to 3 inches (2.54 to 7.6 cm) and are of the type sold by Spraying Systems or BEX. The nozzles 265 of the air conduits 258 and 260 are on a center to center spacing of 1 to 3 inches (2.54 to 7.6 cm) and are of the type sold by Spraying Systems or BEX.

In this non-limiting embodiment of the invention, the polypropylene tanks 190 and 194 (see FIG. 4) contain POWERCRON 920H (available from PPG Industries, Inc., Pittsburgh, Pa., USA), and the polypropylene tank 198 contains ultrafilter permeate instead of tap water. The solar trough mirror 240 having the reflective coating 34 (which includes the zinc film 88) over the convex surface 250 is moved by the conveyor 102 under the coating arrangement 238 to deposit the protective film 35 over the conductive surface of the reflective coating 34, i.e. on the zinc film 88 in a similar manner as discussed above in the discussion of the non-limiting embodiments of EXAMPLE 1 to apply the protective coating 35 of the invention over the reflective coating 34 of the flat solar mirror 70 (see FIG. 3).

Figure 13:
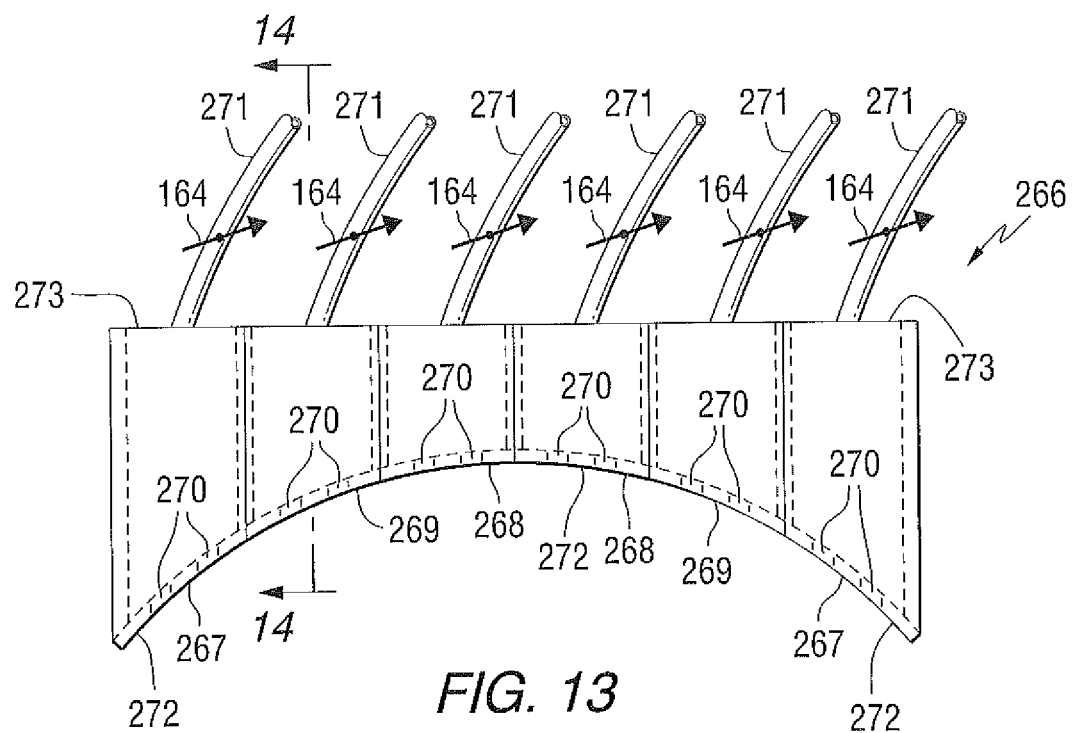
FIG. 13 is a side elevated view of a non-limiting embodiment of a conduit of the invention to apply a protective film over a reflective coating of a shaped solar mirror in accordance to the teachings of the invention.

In another non-limiting embodiment of EXAMPLE 3, the conduits 252, 254 and 256 are replaced with conduit 266 having a pair of outer flow boxes 267, a pair of inner flow boxes 268 and a pair of middle flow boxes 269 as shown in FIG. 13. Each of the flow boxes 267-269 have a plurality of holes or slots 270 (clearly shown in FIG. 14) for the ion containing liquid (hereinafter also referred to as "ionic liquid") to move out of the flow boxes 267-269 to provide the flow curtain 165 (see FIG. 7). Each of the flow boxes 267-269 of the conduit 266 are connected by a tubing 271 to a supply of the cationic liquid or the anionic liquid, as the case maybe, and each of the tubing 271 has the valve and pump arrangement 164 to control the flow of the ionic liquid into the flow boxes and out of the flow boxes by way of the holes 270. Further each of the flow boxes 267-269 of a conduit is connected to a terminal of an electric power supply, e.g. the rectifier 136 (see FIG. 6) to provide the electric potential to deposit the protective film 35 over the reflective coating 34.

Figure 14:
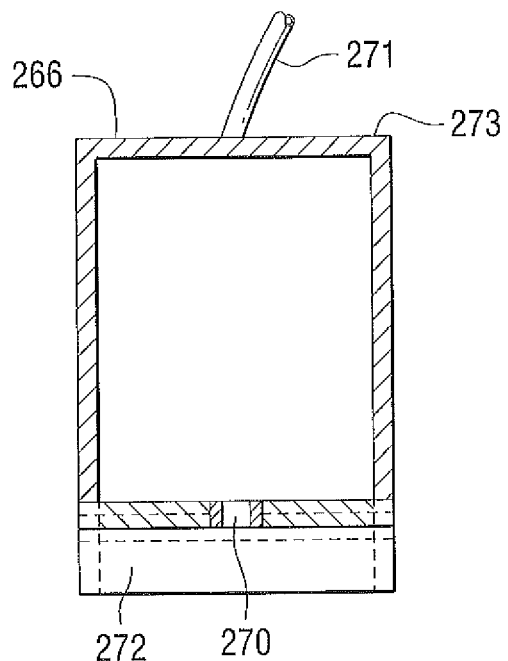
FIG. 14 is view taken along line 14-14 of FIG. 13.

With continued reference to FIGS. 13 and 14, the flow boxes 267-269 are joined together in any usual manner, e.g. by welding or clips, and the conduit 266 is mounted such that side 272 of the flow boxes faces the conveyor 102 (see FIGS. 4 and 5). For applying the protective coating 35 over or on the reflective coating 34 of the trough mirror 238 (see FIG. 12), the sides 272 of the flow boxes 267-269 are shaped such that joining the flow boxes 267-269 together, the sides 272 of the joined flow boxes 267-269 of a conduit 266 has a curved shape similar to the curved shape of the convex surface 250 of the trough mirror 238 (see FIG. 12) and optionally but not limiting to the invention, opposite sides 273 of the flow boxes are shaped to provide a linear surface 273.

Although not limiting to the invention, in the preferred practice of the invention equal flow of the ionic liquid is maintained through the slots 270 of the flow boxes 267-269 of a conduit 266. Adjusting flow rates into the flow boxes of different internal dimensions, e.g. the interior of the flow boxes 267-269 to have the same flow rate of liquid out of the holes and slots of the flow boxes, e.g. the slots 270 of the flow boxes 267-269 is well known in the art and no further discussion is deemed necessary. Further, in another non-limiting embodiment of EXAMPLE 1, the sides 272 of the flow boxes 257-269 can be shaped such that joined flow boxes 267-269 can form a linear surface to apply the protective coating 35 over or on the reflective coating 34 of the flat mirror 70 shown in FIG. 3.

Figure 15:
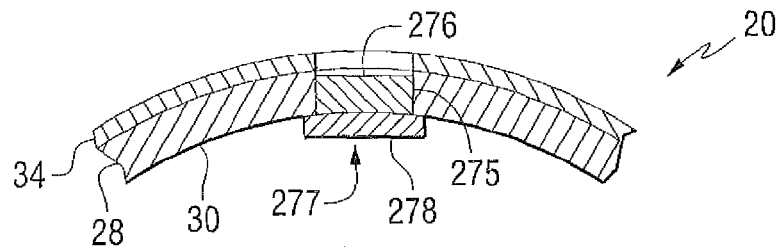
FIG. 15 is a segment of a cross section of the solar mirror of FIG. 1 showing a non-limiting embodiment of a technique of the invention to plug a hole in the transparent substrate of the solar mirror.

Non-limiting embodiments of EXAMPLE 4 of the invention are presented in the following discussion. In one non-limiting embodiment of EXAMPLE 4 of the invention, a protective film 35 is applied over the conductive layer 48 of the reflective coating 34 of the parabolic shaped mirror 20 shown in FIG. 1. In this embodiment of the invention, the conduits 252, 254, 256, 258 and 260, and conduit 266 (if used) are shaped similar to the contour of the convex surface 32 of the mirror 20 between opposite ends, e.g. opposite ends 273 and 274 (see FIG. 1). The length of the conduits is greater than the distance between the opposite ends 273 and 274 of the mirror 20 as measured over the convex surface 32 of the mirror 20. With reference to FIGS. 1 and 15, as needed, in the instance when the parabolic shaped mirror 20 has a hole, e.g. hole 275, the hole 275 can have an end 276 of a plug 277 inserted therein. A cap 278 of the plug 277 has a diameter greater than the diameter of the hole 274 to engage the concave surface 30 of the mirror 20. The insert end 276 of the plug 277 has a height preferably equal to the thickness of the transparent substrate 28 to apply the protective coating 35 of the invention over the reflective coating exposed by the inner wall of the hole 275. As can now be appreciated, the concave surface 30 of the mirror 20 is electrically non-conductive and ionic liquid will not adhere to the concave surface of the mirror 20. In view of the forgoing, the plug 277 can be used if there is an advantage or desire to its use.

Figure 16:
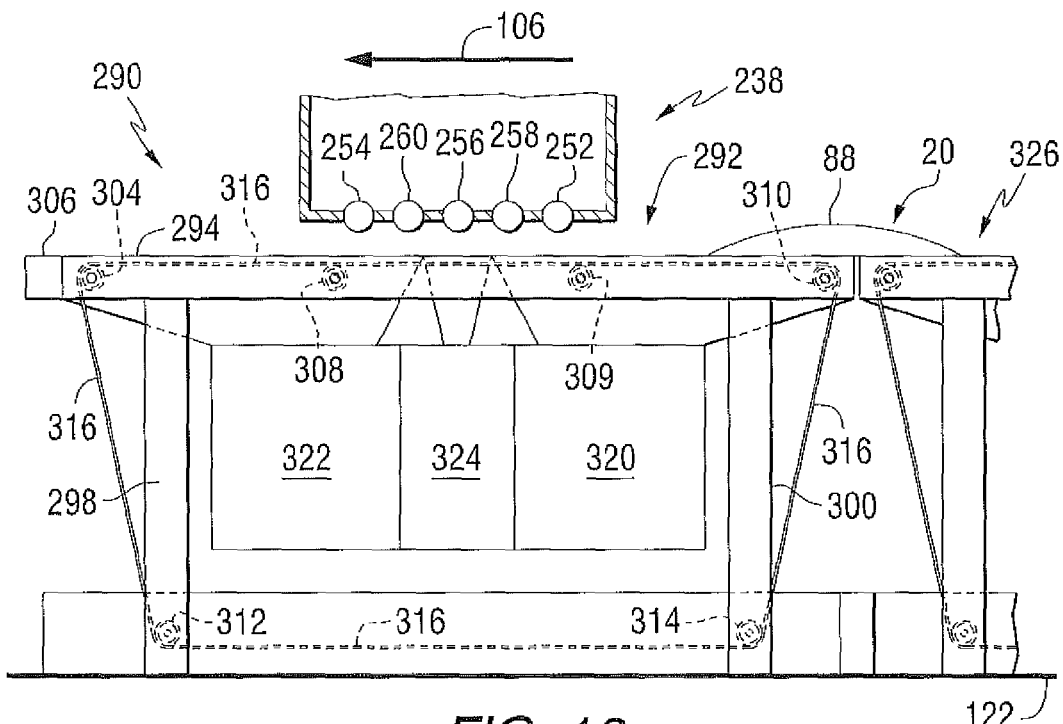
FIG. 16 is a side elevated view of another non-limiting embodiment of a coating station of the invention to apply a protective film in accordance to the teachings of the invention to a shaped solar mirror.
Figure 17:
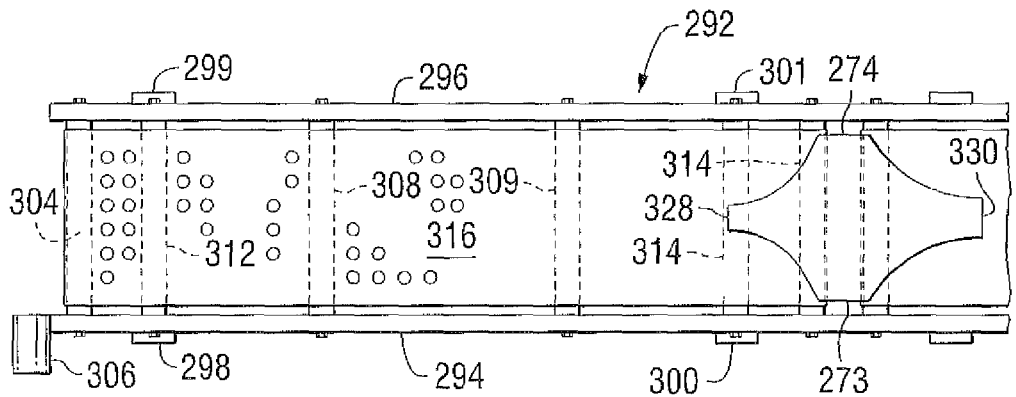
FIG. 17 is an elevated plan view of the coating station shown in FIG. 16 having the coating arrangement 238 removed for purposes of clarity.

With reference to FIGS. 16, and 17 as needed, there is shown a coating station 290 similar to the coating station 100 shown in FIGS. 4 and 5. The coating station 290 includes a belt conveyor 292 having a pair of horizontal beams 294 and 296 supported above the floor 122 by vertical struts 298-301. The belt conveyor 292 includes a cylindrical roller 304 powered by motor 306, a plurality of cylindrical idler rollers 308-310 between the horizontal beams 294 and 296; a cylindrical idler roller 312 between the struts 298 and 299, and a cylindrical idler roller 314 between the struts 300 and 301 (see FIG. 17). The power roller 304 drives an endless conveying belt 316, i.e. a belt that has no ends, or has the ends joined together and has a path defined by the idler rollers 308-310, 312 and 314. The conveyor belt 316 is moved in a counter-clockwise direction to move the solar mirror 20 under the coating arrangement 238 shown in FIG. 16. Surface 318 of the conveying belt 316, and preferably the conveyor belt 318 is electrically non-conductive so as not to short the electric circuit of the coating process. Further, the belt 316 is preferably porous to pass the permeate through the conveyor belt 316 into the polyethylene tanks 320 and 322, and the e-coating liquid into the polyethylene tank 324. More particularly, the conveying belt can be a plastic belt or a belt having a metal core encapsulated in a plastic sheath.

With continued reference to FIG. 16, the mirror 20 is advanced onto the conveying belt 316 from loading conveyor 326. The mirror 20 is advanced by the belt 317 in the direction of the arrow 106 under the coating arrangement 238 to apply the protective coating 35 over or on the conductive surface 48 of the reflective coating 34, e.g. on the surface of the zinc film 88 if present, or on the surface of the PPO film 86, of the mirror 20 in a similar manner as the protective coating 35 was applied over the reflective coating of trough solar mirror 240 (EXAMPLE 3) or over the reflective coating of the flat solar mirror 70 (EXAMPLES 1 and 2). As can be appreciated, the coating arrangement 238 is set above the belt with the conduits 252, 254, 256, 258 and 260 in the same spaced distance from the belt 316. As the parabolic shaped solar mirror 20 moves under the coating arrangement 238 as shown in FIG. 16 in the direction of the arrow 106, the distance between the conduits of the coating arrangement 238 and the coated convex surface of the mirror 20 decreases until the leading edge 328 of the solar mirror 20 passes the conduit 256. After passing the conduit 256 the distance between the conduits of the coating arrangement 238 and the coated convex surface of the mirror 20 increases. Further, because of the shape of the mirror 20, the coating area of the leading edge 328 and of trailing edge 330 of the solar mirror 20 (see FIG. 17) is significantly less than the coating area of the center portion of the mirror, e.g. between the sides 273 and 274 of the mirror 20 which results in less liquid applied to the surface of the mirror 20, and more liquid applied to the belt 316, which liquid passes through the belt into the tanks 320, 322 and 324 as discussed above and reused.

Figure 18:
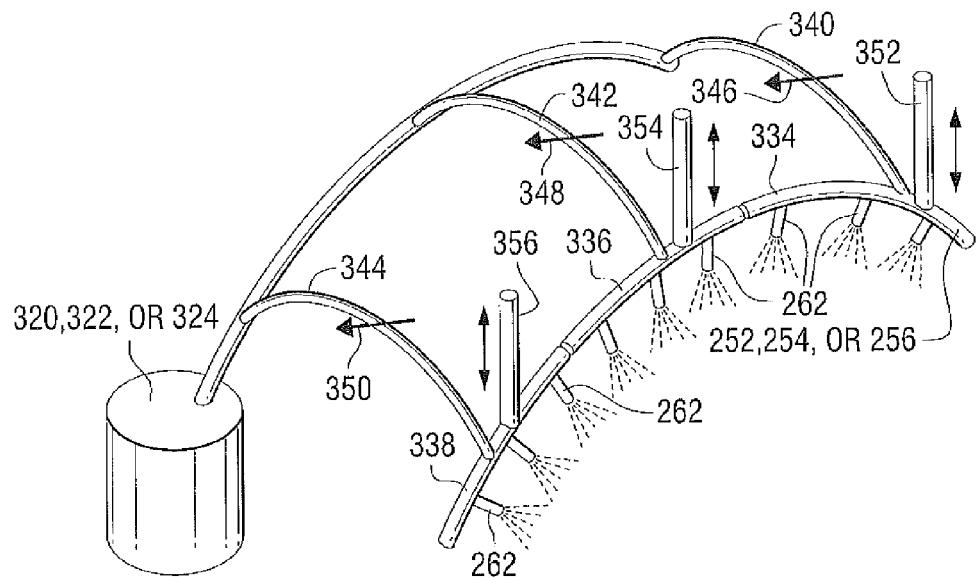
FIG. 18 is a side elevated view of another non-limiting embodiment of a conduit of the invention to apply a protective film over a reflective coating of a shaped solar mirror in accordance to the teachings of the invention.

With reference to FIG. 18, in another non-limited embodiment of EXAMPLE 4 of the invention, the conduits 252, 254 and 256 are divided into three segments 334, 336 and 338.

Each of the segments 334, 336 and 338 are connected by tubing 340, 342 and 344, respectively to its respective liquid supply 320, 322 and 324. For example and not limiting to the discussion, the segments 334, 336 and 338 of the conduit 252 are each connected by tubing 340, 342 and 344, respectively to the anionic liquid, e.g. the tank 320; the segments 334, 336 and 338 of the conduit 254 are each connected by tubing 340, 342 and 344, respectively to the anionic liquid, e.g. the tank 322, and the segments 334, 336 and 338 of the conduit 256 are each connected by tubing 340, 342 and 344, respectively to the cationic liquid, e.g. the tank 324. A pump or valve 346, 348 and 350 is mounted on the conduits 340, 342 and 344, respectively, to move fluid through its respective segment of the conduit when the valve is opened, or the pump is on, and to stop the flow of liquid through its respective segment of the conduit when the valve is closed or the pump is off. Each of the segments 334, 336 and 338 of the conduits 252, 254 and 256, are connected to an elevator shaft 352, 354 and 356, respectively. In the following discussion the features of the embodiment under discussion will be directed to the conduit 252 with the understanding that the discussion is applicable to the conduits 254 and 256 unless indicated otherwise. With reference to FIGS. 16-19, as needed, the conduit 252 is set above the conveyor belt 316 of the conveyor 292 at an initial position, e.g. at a distance greater than the height of the solar mirror supported on the conveyor belt 316 (FIGS. 14 and 15). As the leading edge 328 of the parabolic solar mirror 20 moves toward the conduit 252, the elevator shaft 354 moves the center segment 336 of the conduit 252 toward the conveyor belt 316 and stops at a distance from the belt such that the segment 336 is spaced a predetermined distance above the leading edge 328 of the solar mirror 20 (see FIG. 17), e.g. about 25 mm above the leading edge 328 of the mirror 20. The valve 348 of the center segment 336 is opened to move the anionic fluid through the nozzles 262 of the center segment 336 onto the leading edge 328 of the solar mirror 20. As the belt 316 continues to move the mirror 20 along the path 106, the elevator shaft 354 moves the center segment 262 of the conduit 252 away from the conveyor belt 316 to maintain the spaced distances of 25 mm from the mirror 20. As the mirror 20 moves along the path 106, the width and height of the mirror 20 increases (see FIGS. 16 and 17). The elevator shafts 352 and 356 of the outer segments 252 and 256, respectively of the conduit 252 move downward toward the conveyor belt 316, and the valves 346 and 350 of the segments 252 and 256, respectively, are opened. As the segments 252 and 254 move toward the conveyor belt 316, the elevator shaft 354 moves the segment 336 away from the conveyor belt 316 as the height of the mirror increases as it moves under the segment 336 of the conduit 252. The segments 334, 336 and 338 align with one another to provide the conduit 252 and move away from the conveyor belt 316 as needed to maintain the 25 mm spacing between the conduits and the convex surface of the mirror 20. After the sides 273 and 274 of the mirror 29 (see FIG. 17) pass under the conduit 252, the segments 334, 336 and 338 of the conduit 252 move toward the conveyor belt 316 as the height of the mirror decreases. As the width of the mirror 20 decreases to a length less than the length of the center segment 336, the valves 346 and 350 of the segments 334 and 338 are closed, and the elevator shafts 352 and 356 move the segments 334 and 338 to the initial or starting position. As the trailing end 330 moves past the center segment 336, the valve 348 of the center segment 336 is shut off, or remains on to begin the coating of the next mirror. As can be appreciated the invention is not limited to the number of segments each of the conduits are divided or the number of nozzles each segment has. For example, the conduits can have no segments, and the conduit is moved toward and away from the conveyor belt as the height of the parabolic mirror varies, or the conduit can be divided into two, three, four, five or more segments and can have one or more nozzles.

Regarding the conduits 258 and 260 that provide the air curtains to maintain the cationic and the anionic fluids spaced from one another, the conduits 258 and 260 can be maintained as a single conduit and moved toward and away from the conveyor belt 316 as the height of the mirror 20 decreases and increases, respectively. As the width of the mirror 20 decreases as it moves under the conduits, or the belt is empty, the air from the conduits 258 and 260 can be used to clean the surface of the conveyor belt 316.

Figure 20:
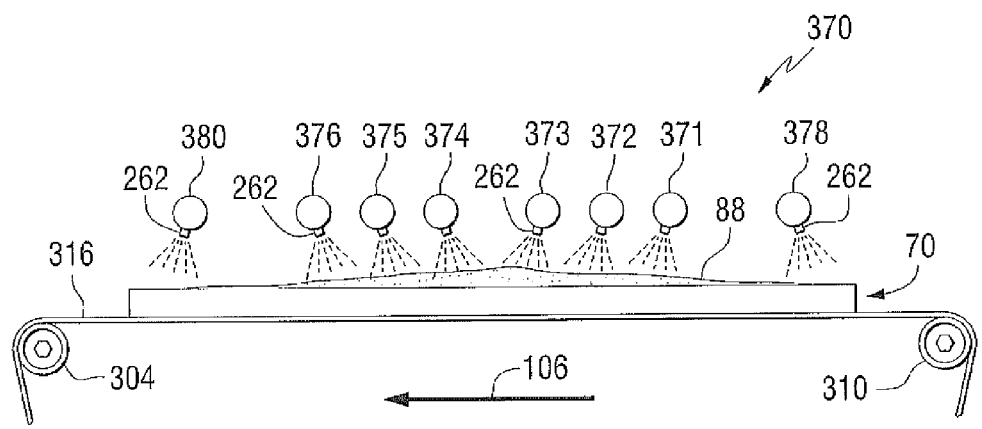
FIG. 20 is a side elevated view of a non-limiting embodiment of a coating arrangement of the invention to apply a protective film over a reflective coating of a solar mirror in accordance to the teachings of the invention.

Non-limiting embodiments of EXAMPLE 5 of the invention are presented in the following discussion. In one non-limiting embodiment of EXAMPLE 5 of the invention the conduits providing the air knifes are eliminated. Coating arrangement 370 shown in FIG. 20 includes six conduits 371-376 for directing the e-coat or cationic liquid toward the conductive surface 48 of the solar mirror 70, and two conduits 378 and 380 for directing the conductive water or permeate toward the conductive surface 48, e.g. the zinc film 88 of the glass mirror 70 surface. As can now be appreciated, the permeate can be directed through the six conduits 371-376 toward the conductive surface 48 of the solar mirror 70, and the e-coat or cationic liquid directed through the two conduits 378 and 380 toward the conductive surface 48 of the glass mirror 70. The nozzles 262 of the conduits 371-373 are angled toward the downstream direction of the path 106, and the nozzles 262 of the conduits 374-376 are angled toward the upstream direction of the path 106. With this arrangement, the cationic fluid from the nozzles 262 of the conduits 371-373 and the cationic fluid from the nozzles 262 of the conduits 374-376 are directed toward one another. The nozzles 262 of the conduit 378 is angled in the upstream direction to move the anionic fluid from the nozzles 262 of the conduit 378 in the upstream direction, and the nozzles 262 of the conduit 380 are angled in the downstream direction to move the anionic fluid from the nozzles 262 of the conduit 380 in the downstream direction. The conduit 380 and the conduit 376 are spaced 6 to 24 inches (15 cm to 0.6 meters) from one another, and the conduit 378 and the conduit 371 are spaced 6 to 24 inches (15 cm to 0.6 meters) from one another. With the above arrangement, the cationic and the anionic fluids are maintained in spaced relation to and out of contact with one another to apply the protective coating 35 over the reflective surface of the solar mirror.

The invention is not limited to the coating thickness of the protective layer 35, or to the applied voltage of the rectifier 136. In the practice of the invention, an applied potential of 400 volts and maximum current of 500 mill amperes resulted in a layer 35 of 5 to 40 microns. The thickness depended on the time and electrodepositable coating composition remained over the reflective coating 34. More particularly, as the time period increased, the thickness of the protective film 35 increased and vice versa. In one non-limiting embodiment of the invention, the coating thickness of the protective coating 35 was in the range of 20-39 microns.

As can be appreciated, the features of the apparatuses used to practice the EXAMPLES 1-5, can be interchanged with one another.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A method of applying an electrically conductive coating over a first surface of a reflective coating of a solar mirror, wherein the solar mirror comprises a substrate having a first major surface and an opposite second major surface, the reflective coating having a second surface opposite to the first surface, wherein the second surface of the reflective coating is over a major surface of the substrate of the solar mirror, the method comprising:

moving a first electrically conductive liquid material over a first area of the first surface of the reflective coating;

moving a second electrically conductive liquid material over a second area of the first surface of the reflective coating, wherein one of the liquid materials comprises an electrodepositable coating composition;

maintaining the first and the second electrically conductive liquid materials spaced from and out of contact with one another to provide a third area of the first surface between the first and the second areas to establish a current path through the first liquid material, the third area of the conductive surface and through the second liquid material, and moving an electric current through the current path to deposit the protective coating over the area of the first surface of the reflective coating having the electrodepositable coating composition.

2. The method according to claim 1 wherein the protective coating is a transparent coating and the second surface of the reflective coating is on the first major surface of the substrate of the solar mirror, and the first major surface of the substrate and the first surface of the reflective coating are designated to be in facing relationship to rays of solar energy.

3. The method according to claim 1 wherein the substrate is a transparent substrate, the second surface of the reflective coating is on the first major surface of the transparent substrate of the solar mirror, and the first major surface of the substrate and the second surface of the reflective coating are designated to be in facing relationship to rays of solar energy.

4. The method according to claim 3 wherein the electrodepositable coating composition is an opaque coating.

5. The method according to claim 3, wherein moving a first electrically conductive liquid material comprises providing a first flow curtain of the first liquid material, moving the second electrically conductive liquid material comprises providing a second flow curtain of the second liquid material, and the maintaining liquid materials spaced from one another comprises directing an electrically non-conductive fluid toward the third area of the reflective coating.

6. The method according to claim 5 wherein the electrically conductive coating is a coating to protect the reflective coating against chemical and mechanical damage, and the fluid is air.

7. The method according to claim 5, wherein the first flow curtain, the second flow curtain and the electrically non-conductive fluid directed toward the third area of the reflective coating comprises a coating arrangement, and further comprising moving the solar mirror and the coating arrangement relative to one another to deposit the electrically conductive coating over the first surface of the reflective coating.

8. The method according to claim 7 wherein the solar mirror is stationary and the coating arrangement moves over the solar mirror.

9. The method according to claim 7 wherein the coating arrangement is stationary and the solar mirror is moved under the coating arrangement.

10. The method according to claim 9 further comprising directing a third flow curtain of a third liquid material toward a fourth area of the first surface of the reflective coating, and directing a second electrically non-conductive fluid toward a fifth area of the reflective coating, wherein the fifth area of the reflective coating is between the second liquid curtain and the third liquid curtain and a spaced distance between the third flow curtain and the first flow curtain is greater than a spaced distance between the third flow curtain and the second flow curtain.

11. The method according to claim 10 wherein the first liquid material and the third liquid material are selected from a group comprising a cationic electrocoat paint and an anionic electrocoat paint, wherein when the first and the third liquid materials are cationic electrocoat paint, the second liquid material is an anion containing liquid material, and when the first and the third materials are anionic electrocoat paint, the second liquid material is a cation containing liquid material.

12. The method according to claim 10 wherein the solar mirror moves in a downstream direction along a path and further comprising moving the first surface of the reflective coating of the solar mirror though a pretreatment area positioned upstream of the first flow curtain to condition the first surface of the reflective coating for the subsequent coating of the first surface of the reflective coating and moving the coated first surface of the reflective coating through a post treatment area positioned downstream of the third liquid curtain.

13. The method according to claim 1 wherein the first and the second liquid materials are spaced from one another by moving the first liquid material over the first area of the reflective coating in a first direction and moving the second liquid material over the second area in a second direction, wherein the first direction is opposite to the second direction.

14. The method according to claim 1 wherein moving a first liquid material comprises providing a first conduit to direct the first electrically conductive liquid material over the first area of the reflective coating and providing a second conduit for directing a third electrically conductive liquid material over a fourth area of the reflective coating; wherein moving a second liquid material comprises providing a third conduit and a fourth conduit between the first and the second conduits, the third and the fourth conduits each directing the second electrically conductive liquid material over the second area of the reflective coating, and wherein the maintaining the first and the second liquid materials spaced from one another comprises directing the liquid material from the third conduit and the fourth conduits toward one another and directing the liquid materials from the first and the second conduits away from one another and away from the second area of the conductive surface.

15. The method according to claim 14 wherein the first and the third electrically conductive material are the same and selected from a group comprising a cationic electrocoat paint and an anionic electrocoat paint, wherein when the first and the third liquid materials are cationic electrocoat paint, the second liquid material is an anion containing liquid material, and when the first and the third materials are anionic electrocoat paint, the second liquid material is a cation containing liquid material.

16. The method according to claim 1, wherein the solar mirror is selected from the group of a flat solar mirror and a shaped solar mirror.

17. The mirror according to claim 16, wherein the substrate has a hole and further comprising inserting a plug in the hole of the solar mirror prior to the practice of moving a first electrically conductive liquid material.

18. The method according to claim 3, wherein the solar mirror is moved along a path through the first and the second electrically conductive liquid materials; the first surface of the solar mirror is a convex surface and the second surface of the solar mirror is a concave surface, and the first and the second electrically conductive liquid materials are dispensed from a first bent conduit and a second bent conduit, respectively with surface of the first and the second bent conduits facing the path.

19. The method according to claim 3, wherein the solar mirror is moved along a path through the first and the second electrically conductive liquid materials; the solar mirror is a shaped solar mirror, the first surface of the solar mirror is a convex surface and the second surface of the solar mirror is a concave surface, and the first and the second electrically conductive liquid materials are dispensed from a first conduit and a second conduit, respectively, wherein each of the conduits comprises a plurality of flow boxes joined together, each of the conduits have a first side and an opposite second side, wherein the first side of each of the conduits faces the path and has a concave surface.

20. The method according to claim 1 further comprising moving the solar mirror along a path through the first and the second electrically conductive liquid materials,
wherein the moving a first electrically conductive liquid material over a first area of the first surface of the reflective coating comprises directing the first electrically conductive liquid toward the path as a first electrically conductive liquid flow curtain and moving the solar mirror along the path through the first flow curtain;
moving a second electrically conductive liquid material over a second area of the first surface of the reflective coating comprises directing the second electrically conductive liquid toward the path as a second electrically conductive liquid flow curtain and moving the solar mirror along the path through the second flow curtain;
maintaining the first and the second electrically conductive liquid materials spaced from one another comprises directing a first air curtain toward the path, and moving the solar mirror along the path through the first air curtain, wherein the solar mirror as it moves along the path in sequence moves through the first flow curtain, the first air curtain and the second flow curtain.

21. The method according to claim 20 further comprising a third electrically conductive liquid flow curtain downstream of the second electrically conductive liquid flow curtain and a second air curtain between the second and the third liquid flow curtains;
wherein the first liquid curtain and the third liquid curtain are selected from a group comprising a cationic electrocoat paint and an anionic electrocoat paint, wherein when the first and the third liquid curtains are cationic electrocoat paint, the second liquid curtain is an anion containing liquid material, and when the first and the third liquid curtains are anionic electrocoat paint, the second liquid curtain is a cation containing liquid material;
moving an electric current comprises moving an electric current along a first current path and along a second current path, wherein the first current path comprises a first terminal of an electric power supply, the first flow curtain, the first area of the first surface of the reflective coating, the second flow curtain and a second terminal of the power supply, and the second current path comprises the second terminal of the power supply, the second flow curtain, an area of the first surface of the reflective coating between the second and the third flow curtains, the third flow curtain and the first terminal of the power supply.

22. The method according to claim 21, wherein the first terminal of the power supply is a negative terminal of the power supply, the second terminal of the power supply is a positive terminal of the power supply, the second liquid curtain is a cationic electrocoat paint and the first and the third liquid curtains are anion containing liquids.

23. The method according to claim 21, wherein the first terminal of the power supply is a positive terminal of the power supply, the second terminal of the power supply is a negative terminal of the power supply, the second liquid curtain is an anion containing liquid and the first and the third liquid curtains are cationic electrocoat paint.

24. The method according to claim 21, wherein the first, second and third flow curtains, and the first and the second air curtains are collectively referred to as a coating arrangement, comprising:
moving the coating arrangement and the first surface of the reflective coating of the solar mirror relative to one another to move portions of the first surface of the reflective coating sequentially through the first coating curtain, the first air curtain, the second coating curtain, the second air curtain, and the third coating curtain, with the first surface of the reflective coating in facing relationship to the coating arrangement,
moving a current through a first current path after the first coating curtain is flowing on portions of the first surface of the reflective coating, and
moving a current through a second current path after the second and the third coating curtains are flowing on portions of the first surface of the reflective coating, wherein the electrically conductive coating is applied to the first surface of the reflective coating of the solar mirror when the current is moving through at least one of the first and the second current paths.

25. The method of claim 1, wherein the ionic coating compound comprises an ionic film-forming polymer.

26. The method according to claim 1, wherein the solar mirror has a first end, an opposite second end, a first side and an opposite second side, wherein width of the first surface of the reflective coating of the solar mirror measured between the first and the second sides increases as the distance from the first end increases to a location spaced a first predetermined distance from the first end, and the width of the first surface of the reflective coating of the solar mirror decreases as the spaced distance from the location increases and the distance from the second end decreases, wherein moving a first electrically conductive liquid material comprises directing a first segment of the first liquid material toward the first surface of the reflective coating, wherein length of the first segment is greater than the width at the first end of the solar mirror and less than the width at the location of the solar mirror and at a second predetermined distance from the first end of the solar mirror increasing the length of the first segment to provide a second segment of the first liquid material, wherein the length of the second segment is greater than the width of the solar mirror at the location; at a third predetermined distance from the first end decreasing the length of the second segment to a third segment, wherein the length of the third segment is greater than the second end of the mirror and less than the width of the mirror at the location.

* * * * *